(12) United States Patent
Hattori et al.

(10) Patent No.: US 12,173,161 B2
(45) Date of Patent: Dec. 24, 2024

(54) NEAR-INFRARED ABSORBING DYE, OPTICAL FILTER, AND IMAGING DEVICE

(71) Applicant: AGC Inc., Tokyo (JP)

(72) Inventors: Shigeki Hattori, Tokyo (JP); Shota Yoshioka, Tokyo (JP)

(73) Assignee: AGC Inc., Tokyo (JP)

( * ) Notice: Subject to any disclaimer, the term of this patent is extended or adjusted under 35 U.S.C. 154(b) by 1031 days.

(21) Appl. No.: 17/101,182

(22) Filed: Nov. 23, 2020

(65) Prior Publication Data

US 2021/0071004 A1   Mar. 11, 2021

Related U.S. Application Data

(63) Continuation of application No. PCT/JP2019/020931, filed on May 27, 2019.

(30) Foreign Application Priority Data

May 30, 2018 (JP) .................................. 2018-103772

(51) Int. Cl.
*C09B 57/00* (2006.01)
*C08K 5/45* (2006.01)
(Continued)

(52) U.S. Cl.
CPC .............. *C09B 57/007* (2013.01); *C08K 5/45* (2013.01); *G02B 5/208* (2013.01); *H01L 27/14625* (2013.01)

(58) Field of Classification Search
CPC ........ C09B 57/007; C08K 5/45; G02B 5/208; H01L 27/14625
See application file for complete search history.

(56) References Cited

U.S. PATENT DOCUMENTS 9,445,017 B2 * 9/2016 Konishi .................. C03C 3/247
2014/0264202 A1  9/2014 Nagaya et al.
(Continued)

FOREIGN PATENT DOCUMENTS

WO   WO 2013/054864 A1   4/2013
WO   WO 2014/168189 A1   10/2014
(Continued)

OTHER PUBLICATIONS

International Search Report issued Jul. 23, 2019 in PCT/JP2019/020931 filed May 27, 2019, 1 page.

*Primary Examiner* — Andrew D Kosar
*Assistant Examiner* — John D McAnany
(74) *Attorney, Agent, or Firm* — Oblon, McClelland, Maier & Neustadt, L.L.P.

(57) ABSTRACT

A near-infrared absorbing dye includes a compound represented by formula (A). Each of $R^{11}$ to $R^{14}$ is independently a hydrogen atom, a halogen atom, a hydroxyl group, or an alkyl, aryl or alaryl group. Each of pairs $R^{11}$ and $R^{12}$, $R^{12}$ and $R^{13}$, and $R^{13}$ and $R^{14}$ may combine with one another to form a monocyclic ring or a polycyclic ring in which from 2 to 4 rings are fused. Each of $R^{15}$ and $R^{16}$ is independently
(Continued)

an alkyl or alaryl group. $R^{15}$ and $R^{16}$ may combine with one another to form a cyclohetero ring having from 5 to 10 members together with the nitrogen atom.

(51) Int. Cl.
*G02B 5/20* (2006.01)
*H01L 27/146* (2006.01)

(56) References Cited

U.S. PATENT DOCUMENTS

| | | |
|---|---|---|
| 2016/0011348 A1 | 1/2016 | Hirakoso et al. |
| 2016/0018576 A1 | 1/2016 | Yamamoto et al. |
| 2017/0003417 A1 | 1/2017 | Nagaya et al. |
| 2017/0003425 A1 | 1/2017 | Nagaya et al. |
| 2018/0259849 A1 | 9/2018 | Hirai et al. |
| 2018/0364095 A1 | 12/2018 | Nagaya et al. |

FOREIGN PATENT DOCUMENTS

| | | | |
|---|---|---|---|
| WO | WO 2014/168190 A1 | 10/2014 | |
| WO | WO 2016/158461 A1 | 10/2016 | |
| WO | WO 2017/094672 A1 | 6/2017 | |
| WO | WO-2017104283 A1 * | 6/2017 | ........... C07D 333/22 |

* cited by examiner

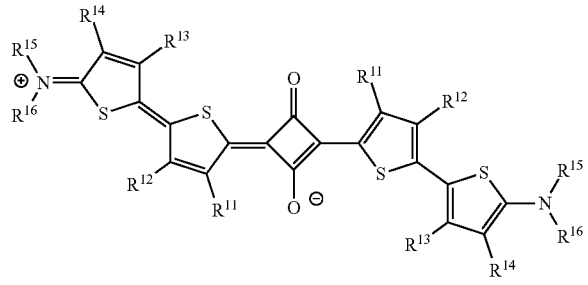

(A)

12 Claims, 2 Drawing Sheets

NEAR-INFRARED ABSORBING DYE, OPTICAL FILTER, AND IMAGING DEVICE

TECHNICAL FIELD

The present invention relates to a near-infrared absorbing dye, an optical filter, each of which transmits light in the visible wavelength range and blocks light in the near-infrared wavelength range, and an imaging device including the optical filter.

BACKGROUND ART

In an imaging device using a solid-state image sensor, an optical filter that transmits light in the visible region (hereinafter, sometimes referred to as "visible light") and blocks light in the near-infrared region (hereinafter, sometimes referred to as "near-infrared light") is used so as to successfully reproduce a color tone and obtain a clear image. As the optical filter, a near-infrared cut filter including an absorption layer containing near-infrared absorbent and a reflection layer including a dielectric multilayer film that blocks near-infrared light, is common. More specifically, since a spectral transmittance curve of the dielectric multilayer film itself changes depending on an incident angle, a near-infrared cut filter including both a reflection layer and an absorption layer has a spectral transmittance curve with reduced incident angle dependence due to absorption characteristics of the absorption layer.

Recently, in various instruments having mounted thereon such an imaging device, an optical component using near-infrared light with a long wavelength, for example, laser light with a wavelength of 850 nm to 1,100 nm, is often mounted together. Consequently, the near-infrared cut filter is required to have a property of sufficiently cutting the near-infrared light with a long wavelength while avoiding reduction in the visible light transmittance.

As regards the near-infrared cut filter, many techniques using an absorbent exhibiting absorption in a relatively long wavelength range have been common. Specifically, there are common techniques, for example, using a squarylium dye (see, for example, Patent Literature 1), using a combination of a squarylium dye with a cyanine dye, a phthalocyanine dye, etc. (see, for example, Patent Literatures 2 and 3), or using a diimmonium dye, a metal dithiolate complex, an inorganic particle, etc. (see, for example, Patent Literatures 4, 5 and 6).

CITATION LIST

Patent Literature

Patent Literature 1: WO 2017/104283 A1
Patent Literature 2: WO 2013/054864 A1
Patent Literature 3: WO 2016/158461 A1
Patent Literature 4: WO 2017/094672 A1
Patent Literature 5: WO 2014/168189 A1
Patent Literature 6: WO 2014/168190 A1

SUMMARY OF INVENTION

Technical Problem

However, none of the above-described near-infrared cut filters satisfies both high visible light transmission and high blocking property to near-infrared light with a long wavelength.

An object of the present invention is to provide a near-infrared absorbing dye, an optical filter, each having excellent near-infrared blocking property, particularly, blocking property to long-wavelength near-infrared light, and having high visible light transmission, and an imaging device using the optical filter, which exhibits excellent color reproducibility.

Solution to Problem

The present invention provides a near-infrared absorbing dye (hereinafter, sometimes referred to as "near-infrared absorbing dye (A)") including a compound represented by formula (A).

[Chem. 1]

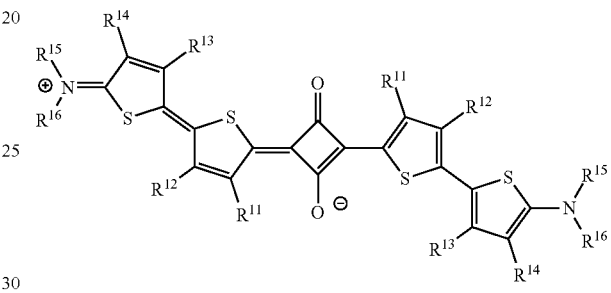

In formula (A), each of $R^{11}$ to $R^{14}$ is independently a hydrogen atom, a halogen atom, a hydroxyl group, or an alkyl, aryl or alaryl group which may include a substituent, may contain an unsaturated bond, an oxygen atom, an ester bond, an amide bond, or a thioamide bond between carbon-carbon atoms, and may include an oxygen atom, an ester bond, an amide bond, or a thioamide bond on a terminal bonded to the thiophene ring. Each of pairs $R^{11}$ and $R^{12}$, $R^{12}$ and $R^{13}$, and $R^{13}$ and $R^{14}$ may combine with one another to form a monocyclic ring or a polycyclic ring in which from 2 to 4 rings are fused, and in this case, a hydrogen atom bonded to the ring may be substituted by a substituent.

Each of $R^{15}$ and $R^{16}$ is independently an alkyl or alaryl group which may include a substituent and may contain an unsaturated bond, an oxygen atom or a nitrogen atom between carbon-carbon atoms. $R^{15}$ and $R^{16}$ may combine with one another to form a cyclohetero ring having from 5 to 10 members together with the nitrogen atom, and in this case, a hydrogen atom bonded to the ring may be substituted by a substituent.

An optical filter in the present invention includes an absorption layer containing the near-infrared absorbing dye (A) and a resin.

An imaging device in the present invention includes a solid-state image sensor, an imaging lens, and the optical filter.

Advantageous Effects of Invention

In the present invention, a near-infrared absorbing dye having excellent near-infrared blocking property, particularly, long-wavelength near-infrared blocking property, and having high visible light transmission can be provided. Furthermore, in the present invention, an optical filter using the dye, and an imaging device using the optical filter, which exhibits excellent color reproducibility, can be provided.

DESCRIPTION OF EMBODIMENTS

Figure 1:
FIG. 1 is a cross-sectional view schematically illustrating one example of the optical filter of an embodiment.

The embodiments of the present invention are described below.

In the present description, the near-infrared absorbing dye and the ultraviolet absorbing dye are sometimes simply referred to as "NIR dye" and "UV dye", respectively.

In the present description, a compound represented by formula (A) is referred to as compound (A). The same applies to the compounds represented by other formulae. An NIR dye including the compound (A) is sometimes referred to as NIR dye (A), and the same applies to other dyes. In addition, for example, a group represented by formula (1a) is sometimes referred to as group (1a), and the same applies to the groups represented by other formulae.

In the present description, the numerical range expressed using "to" includes both of its upper and lower limits.

<NIR Dye (A)>

As shown in formula (A), the NIR dye (A) of the present invention has a squarylium skeleton in the center of a molecular structure, and contains a group which has two connected thiophene groups and in which the thiophene ring on the side far from the squarylium skeleton has an amino group (with the proviso that the aromatic ring is not directly bonded to the nitrogen atom) being bonded to each of the left and right sides of the squarylium skeleton.

[Chem. 2]

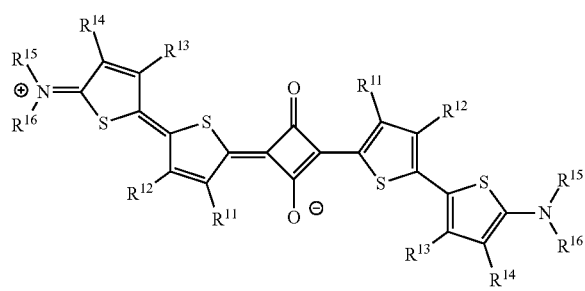

(A)

Each of $R^{11}$ to $R^{14}$ is independently a hydrogen atom, a halogen atom, a hydroxyl group, an alkyl group, an aryl group, or an alaryl group.

The alkyl group, aryl group or alaryl group may include a substituent.

In addition, the alkyl group, aryl group or alaryl group may contain an unsaturated bond, an oxygen atom, an ester bond, an amide bond, or a thioamide bond between carbon-carbon atoms.

Furthermore, the alkyl group, aryl group or alaryl group may have an oxygen atom, an ester bond, an amide bond, or a thioamide bond on the terminal bonded to the thiophene ring.

Incidentally, "the alkyl group, aryl group or alaryl group may include a substituent" indicates that a hydrogen atom bonded to a carbon atom in the alkyl group, aryl group or alaryl group may be substituted by a substituent. In addition, "the aryl group or alaryl group may contain an unsaturated bond, an oxygen atom, an ester bond, an amide bond, or a thioamide bond between carbon-carbon atoms" indicates that the alkyl group of the aryl group or alaryl group may contain an unsaturated bond, an oxygen atom, an ester bond, an amide bond, or a thioamide bond between carbon-carbon atoms.

The ester bond may be —O—C(=O)— or —C(=O)—O— from the side close to the thiophene ring. The amide bond may be —NR—C(=O)— or —C(=O)—NR— from the side close to the thiophene ring. The thioamide bond may be —NR—C(=S)— or —C(=S)—NR— from the side close to the thiophene ring. Here, R in the amide bond and thioamide bond is a hydrogen atom or an alkyl group having a carbon number of 1 to 12.

Two $R^{11}$s in formula (A) may be different between the left and right sides of the squarylium skeleton, but in view of ease of production, they are preferably the same between the left and right sides. The same applies to $R^{12}$ to $R^{14}$ and later-described $R^{15}$ and $R^{16}$.

Here, in the present description, unless specified otherwise, the alkyl group may have a linear, branched or cyclic structure or a structure formed by combining these structures. The alkyl group may have an unsaturated bond between carbon-carbon atoms in the case where the alkyl group is linear or branched or in the case where the alkyl group is cyclic and does not form an aromatic ring. Examples of the alkyl group which is cyclic and has an unsaturated bond between carbon-carbon atoms but does not form an aromatic ring, include a cycloalkene.

In any case where the alkyl group is linear, branched or cyclic, the alkyl group may have an oxygen atom, an ester bond, an amide bond, or a thioamide bond between carbon-carbon atoms. The same applies to the alkyl group that the alkoxy group has. Furthermore, the same applies to the alkyl group in the case where the aryl group described below has an alkyl group, and the alkyl group in the case where the alaryl group has an alkyl group. Examples of the halogen atom include a fluorine atom, a chlorine atom, a bromine atom, an iodine atom, etc. A fluorine atom and a chlorine atom are preferred as a halogen atom.

In the present description, unless specified otherwise, examples of the aryl group indicate a group bonded through a carbon atom constituting an aromatic ring of an aromatic compound, for example, a benzene ring, a naphthalene ring, a biphenyl, a furan ring, a thiophene ring, a pyrrole ring, etc. Examples of the aryl group include a structure where a hydrogen atom bonded to a ring member atom except for the carbon atom contributing to the bonding above is substituted by an alkyl group, for example, a tolyl group and a xylyl group.

In the present description, unless specified otherwise, the alaryl group indicates a group bonded through a carbon atom constituting the alkyl group which is bonded to an aromatic ring. Examples of the alaryl group include a structure in which a hydrogen atom bonded to a ring member atom except for an atom to which the alkyl group contributing to the bonding above is bonded, is substituted by an alkyl group.

The substituent in $R^{11}$ to $R^{14}$ includes a halogen atom, a hydroxyl group, a carboxy group, a sulfo group, a cyano group, an amino group, an N-substituted amino group, a nitro group, an alkoxycarbonyl group, a carbamoyl group, an N-substituted carbamoyl group, an imide group, and an alkoxy group having a carbon number of 1 to 10. In the case where $R^{11}$ to $R^{14}$ are an aryl group or an alaryl group, the substituent is a group substituting for a hydrogen atom bonded to the aromatic ring or a hydrogen atom of an alkyl group that they have, and an aryl group is further included in addition to the substituents described above.

In the case where $R^{11}$ to $R^{14}$ are an alkyl group, the carbon number is preferably from 1 to 20, more preferably from 1 to 15, still more preferably from 1 to 12. In the case where $R^{11}$ to $R^{14}$ are an aryl group, the carbon number is preferably from 4 to 20, more preferably from 4 to 17, still more preferably from 4 to 14. In the case where $R^{11}$ to $R^{14}$ are an alaryl group, the carbon number is preferably from 5 to 20, more preferably from 5 to 18, still more preferably from 5 to 15.

In the case where $R^{11}$ to $R^{14}$ include a substituent, the carbon number above includes the carbon number of the substituent.

Examples of $R^{11}$ to $R^{14}$ also include a configuration where the alkyl group, aryl group or alaryl group has an oxygen atom, an ester bond, an amide bond, or a thioamide bond on the terminal bonded to the thiophene ring. The group having an oxygen atom on the terminal bonded to the thiophene ring is represented, for example, by —OX, in which X is an alkyl group, an aryl group, or an alaryl group. The group having an ester bond on the terminal bonded to the thiophene ring is represented, for example, by —O—C(=O)—X or —C(=O)—O—X, in which X is an alkyl group, an aryl group, or an alaryl group.

The group having an amide bond on the terminal bonded to the thiophene ring is represented, for example, by —NR—C(=O)—X or —C(=O)—NR—X, in which X is an alkyl group, an aryl group, or an alaryl group. The group having a thioamide bond on the terminal bonded to the thiophene ring is represented, for example, by —NR—C(=S)—X or —C(=S)—NR—X, in which X is an alkyl group, an aryl group, or an alaryl group. Here, R in the amide bond and thioamide bond is a hydrogen atom or an alkyl group having a carbon number of 1 to 12.

Even in such a case, the alkyl group, aryl group or alaryl group may include a substituent and may contain an unsaturated bond, an oxygen atom, an ester bond, an amide bond, or a thioamide bond between carbon-carbon atoms.

Each of the pairs $R^{11}$ and $R^{12}$, $R^{12}$ and $R^{13}$, and $R^{13}$ and $R^{14}$ may combine with one another to form a monocyclic ring or a polycyclic ring in which from 2 to 4 rings are fused, and in this case, a hydrogen atom bonded to the ring may be substituted by a substituent.

The ring formed by the combining of $R^{11}$ and $R^{12}$ and of $R^{13}$ and $R^{14}$ may be an alicyclic ring or an aromatic ring and may be a hydrocarbon ring or a heterocyclic ring. The ring is preferably an aromatic ring. Examples of the monocyclic ring include a benzene ring, and examples of the polycyclic ring include a naphthalene ring, an anthracene ring, a phenanthrene ring, a tetracene ring, a chrysene ring, etc. The hydrogen atom bonded to a ring formed by the combining of $R^{11}$ and $R^{12}$ and of $R^{13}$ and $R^{14}$ may be substituted by a substituent.

In the case where $R^{12}$ and $R^{13}$ are combined, the NIR dye (A) contains a structure in which a ring is formed between two thiophene rings and at least three rings are fused. The hydrogen atom bonded to a ring formed by the combining of $R^{12}$ and $R^{13}$ may be substituted by a substituent.

Examples of the substituent substituting for the hydrogen atom bonded to such a ring includes the same groups as the substituents in $R^{11}$ to $R^{14}$ and a hydrocarbon group which may include a substituent. Examples of the substituent that the hydrocarbon group has includes the same groups as the substituents in $R^1$ to $R^{14}$. Furthermore, in the case where a hydrocarbon group is bonded to a ring, they may combine with $R^{11}$ to $R^{14}$ having not formed a ring to form a ring. For example, in the case where $R^{12}$ and $R^{13}$ are combined to form a divalent group —$CR^aR^b$—, each of $R^a$ and $R^b$ may form a ring with $R^{14}$ or $R^{11}$.

Each of $R^{15}$ and $R^{16}$ is independently an alkyl or alaryl group which may include a substituent and may contain an unsaturated bond, an oxygen atom or a nitrogen atom between carbon-carbon atoms. In addition, $R^{15}$ and $R^{16}$ may combine with one another to form a cyclohetero ring having from 5 to 10 members together with a nitrogen atom, and in this case, a hydrogen atom bonded to the ring may be substituted by a substituent.

Examples of the substituent in $R^{15}$ and $R^{16}$ include the same substituents as the substituents in $R^{11}$ to $R^{14}$, more specifically, a halogen atom, a hydroxyl group, a carboxy group, a sulfo group, a cyano group, an amino group, an N-substituted amino group, a nitro group, an alkoxycarbonyl group, a carbamoyl group, an N-substituted carbamoyl group, an imide group, an alkoxy group having a carbon number of 1 to 10, etc. In the case where $R^{15}$ and $R^{16}$ are an alaryl group, the alkyl group that they have may be further substituted by an aryl group.

In the case where $R^{15}$ and $R^{16}$ do not form a cyclohetero ring, each of them is a group not having a structure in which an aromatic ring is directly bonded to the nitrogen atom. In this case, $R^{15}$ and $R^{16}$ may be a group having an aromatic ring not directly bonded to the nitrogen atom or may be a group having no aromatic ring. In the case where $R^{15}$ and $R^{16}$ have an aromatic ring, this is advantageous in view of heat resistance or increase in the NIR absorption wavelength. In the case where $R^{15}$ and $R^{16}$ do not have an aromatic ring, this is advantageous in view of light resistance, ease of production or solubility in a resin and a solvent.

In the case where $R^{15}$ and $R^{16}$ are an alkyl group, the carbon number thereof is preferably from 1 to 20, more preferably from 1 to 12, still more preferably from 1 to 10. In view of visible light transmission or solubility in a resin and a solvent, $R^{15}$ and $R^{16}$ are preferably a linear, branched or cyclic alkyl group having a carbon number of 3 to 20, which may contain an oxygen atom between carbon-carbon atoms. The carbon number of the alkyl group is preferably from 3 to 12 in the case of a linear alkyl group, preferably from 3 to 10 in the case of a branched alkyl group, and preferably from 5 to 10 in the case of a cyclic alkyl group. In the case where $R^{15}$ and $R^{16}$ include a substituent, the carbon number above includes the carbon number of the substituent.

$R^{15}$ and $R^{16}$ are more preferably, for example, a group selected from groups (1a) to (15a), still more preferably group (1a).

[Chem. 3]

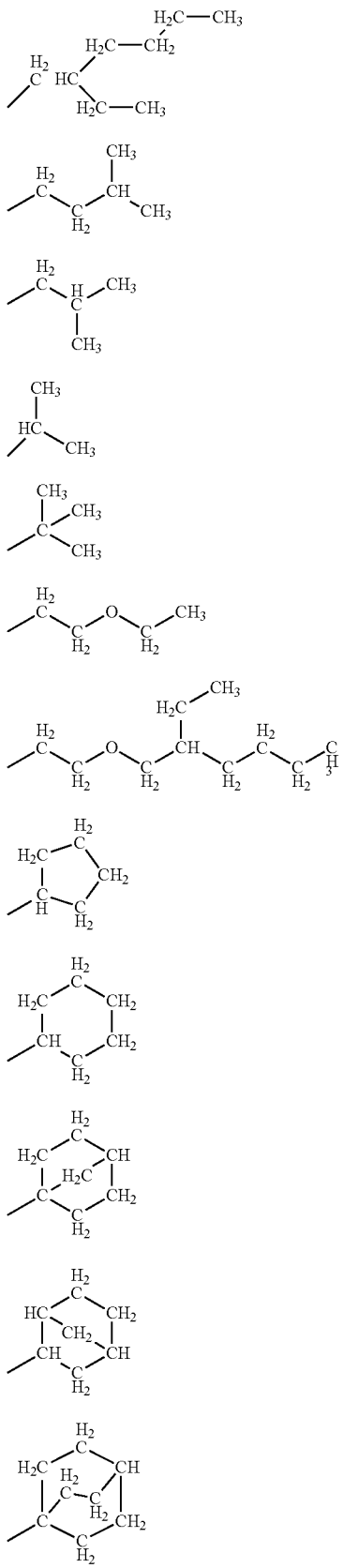
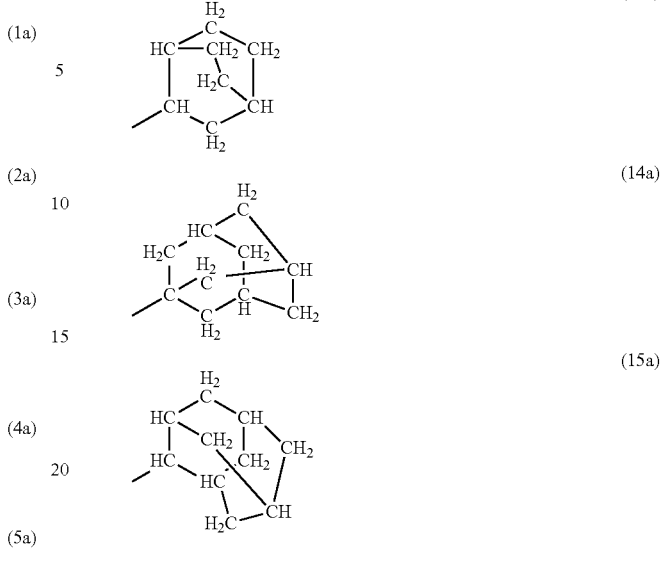

(1a)
(2a)
(3a)
(4a)
(5a)
(6a)
(7a)
(8a)
(9a)
(10a)
(11a)
(12a)
(13a)
(14a)
(15a)

$R^{15}$ and $R^{16}$ may combine with one another to form a cyclohetero ring having from 5 to 10 members together with the nitrogen atom. The cyclohetero ring may contain an oxygen atom as a ring constituent element, other than the nitrogen atom. The number of members in the cyclohetero ring is preferably 5 or 6, more preferably 5. In the case where a hydrogen atom bonded to the cyclohetero ring is substituted, examples of the substituent substituting for the hydrogen atom include a halogen atom, a hydroxyl group, an alkyl or alkoxy group having a carbon number of 1 to 10, an aryl group having a carbon number of 6 to 20, and an alaryl group having a carbon number of 7 to 20.

In the case where the divalent group formed by the combining of $R^{15}$ and $R^{16}$ is represented by -Q-, specifically, examples of -Q- include the following groups (11) to (14).

$$-(CH_2)_4- \quad (11)$$

$$-(CH_2)_5- \quad (12)$$

$$-C(CH_3)_2(CH_2)_2C(CH_3)_2- \quad (13)$$

$$-C(CH_3)_2(CH_2)_3C(CH_3)_2- \quad (14)$$

The structure of the NIR dye (A) is a structure where carbon-carbon single bonds and four or more double bonds are alternately connected from the squarylium skeleton in the center to the amino group at both ends, and is a structure where in formula (A), except for the substituents of $R^{11}$ to $R^{16}$, the carbon-carbon chain connecting the squarylium skeleton and the amino group at both ends does not contain a benzene ring.

Since the NIR dye (A) has four or more carbon-carbon double bonds between the squarylium skeleton in the center and the amino group at both ends and thus the π-conjugated structure is large, the NIR dye exhibits high absorption characteristics on the long wavelength side of near-infrared light. Moreover, since the above-described unnecessary benzene ring is not contained, the transmittance of visible light, particularly the transmittance of blue light, which is a short wavelength side of visible light, is high. Furthermore, the structure of the NIR dye (A) is not a structure where in formula (A), an aromatic ring is directly bonded to the nitrogen atom to which $R^{15}$ and $R^{16}$ are bonded, and therefore, the property of donating electrons to the thiophene ring from the amino group to which $R^{15}$ and $R^{16}$ are directly bonded is strengthened. As a result, not only the transmittance of visible light on the short wavelength side increases but also high absorption characteristics for near-infrared light on the longer wavelength side are exhibited.

The NIR dye (A) is preferably, for example, a compound (NIR dye (Aa)) represented by the following formula (Aa) or a compound (NIR dye (Ab)) represented by the later-described formula (Ab). The NIR dye (Aa) is a compound of NIR dye (A) in which $R^{12}$ and $R^{13}$ are combined to form a cyclopentadithiophene ring. The NIR dye (Ab) is a compound of NIR dye (A) including a structure in which $R^{12}$ and $R^{13}$ are not combined and two thiophene rings are bonded.

(NIR Dye (Aa))

The NIR dye (Aa) has a squarylium skeleton in the center of a molecular structure and has a structure where one cyclopentadithiophene ring is bonded to each of the left and right sides of the squarylium skeleton and in the cyclopentadithiophene ring, the thiophene ring on the side opposite to the squarylium skeleton has an amino group (with the proviso that the aromatic ring is not directly bonded to the nitrogen atom).

[Chem. 4]

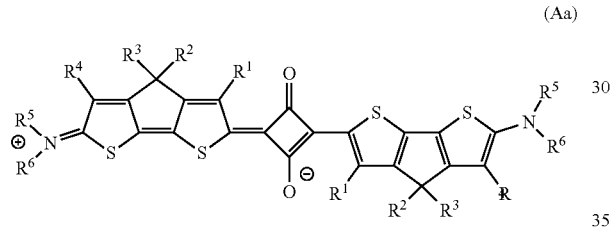

(Aa)

In formula (Aa), each of $R^1$ to $R^4$ is independently a hydrogen atom, a halogen atom, a hydroxyl group, or an alkyl, aryl or alaryl group which may include a substituent, may contain an unsaturated bond, an oxygen atom, an ester bond, an amide bond, or a thioamide bond between carbon-carbon atoms, and may have an oxygen atom, an ester bond, an amide bond, or a thioamide bond on the terminal bonded to the thiophene ring. $R^5$ and $R^6$ have the same meanings as $R^{15}$ and $R^{16}$ in formula (A).

$R^1$ in formula (Aa) corresponds to $R^{11}$ in formula (A) and can be the same atom or group as $R^{11}$. In the NIR dye (Aa), in view of photostability, $R^1$ is preferably a hydrogen atom or an alkyl group having a carbon number of 1 to 12, more preferably a hydrogen atom.

In view of visible light transmission, light resistance or solubility in a resin and a solvent, $R^2$ and $R^3$ are preferably a linear, branched or cyclic alkyl group having a carbon number of 1 to 20, which may contain an oxygen atom between carbon-carbon atoms. The carbon number of the alkyl group is more preferably from 1 to 12 in the case of a linear alkyl group, more preferably from 3 to 10 in the case of a branched alkyl group, and more preferably from 5 to 10 in the case of a cyclic alkyl group. $R^2$ and $R^3$ are more preferably, for example, a group selected from the groups (1a) to (15a), still more preferably group (1a), group (3a), or group (9a).

In view of heat resistance, light resistance or increase in the NIR absorption wavelength, $R^2$ and $R^3$ are more preferably a phenyl group which may have from 1 to 5 substituents, a naphthyl group which may have from 1 to 7 substituents, or a cyclic alkyl group having a carbon number of 5 to 10. The substituent of the phenyl group and naphthyl group includes an alkyl or alkoxy group having a carbon number of 1 to 12, which may contain an unsaturated bond or an oxygen atom between carbon-carbon atoms, and an alkylamino group (in which the carbon number of the alkyl group is from 1 to 12), and among others, a methyl group, a tertiary butyl group, a dimethylamino group, a methoxy group, etc. are preferred. It is preferable that the phenyl group and naphthyl group are preferably unsubstituted or from 1 to 3 hydrogen atoms thereof are substituted.

Specifically, examples of the phenyl group which may have from 1 to 5 substituents include groups (P1) to (P9).

[Chem. 5]

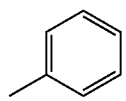
(P1)

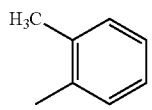
(P2)

(P3)

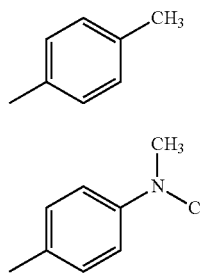
(P4)

(P5)

(P6)

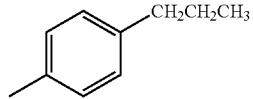
(P7)

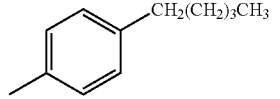
(P8)

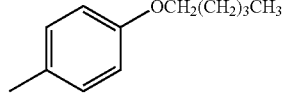
(P9)

Specifically, examples of the naphthyl group which may have from 1 to 7 substituents include groups (N1) to (N9).

[Chem. 6]

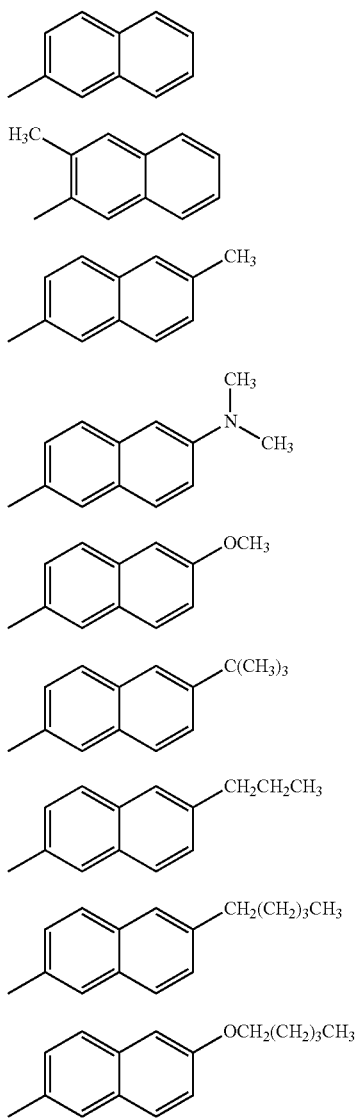

R² and R³ are, specifically, preferably a methyl group, a phenyl group, a naphthyl group, a toluyl group, a 3,5-di-tertiary butylphenyl group, a cyclohexyl group, an isopropyl group, a 2-ethylhexyl group, etc., more preferably a phenyl group, a cyclohexyl group, or an isopropyl group.

$R^4$ in formula (Aa) corresponds to $R^{14}$ in formula (A) and can be the same atom or group as $R^{14}$. In the NIR dye (Aa), in view of visible light transmission or solubility in a resin and a solvent, as with $R^2$ and $R^3$, $R^4$ is preferably a linear, branched or cyclic alkyl group having a carbon number of 1 to 20, which may contain an oxygen atom between carbon-carbon atoms. The carbon number of the alkyl group is more preferably from 1 to 12 in the case of a linear alkyl group, more preferably from 3 to 10 in the case of a branched alkyl group, and more preferably from 5 to 10 in the case of a cyclic alkyl group. $R^4$ is more preferably, for example, a group selected from groups (1a) to (15a), still more preferably group (1a).

In view of ease of production, $R^4$ is preferably a hydrogen atom or an alkyl group having a carbon number of 1 to 8, more preferably a hydrogen atom.

$R^5$ and $R^6$ in formula (Aa) are the same as $R^{15}$ and $R^{16}$ in formula (A), including preferred embodiments.

In the NIR dye (Aa), it is preferred that out of $R^1$ to $R^6$, 2 or more members, more preferably 3 or more members, still more preferably all of 4 members, selected from $R^2$, $R^3$, $R^5$ and $R^6$ are a linear or branched alkyl group having a carbon number of 3 to 20, which may contain an oxygen atom between carbon-carbon atoms. In this case, an NIR dye (Aa) having high visible light transmission or high solubility in a resin and a solvent can be obtained.

Examples of the NIR dye (Aa) include, more specifically, those where $R^1$ to $R^6$ are the compounds shown in Table 1 below (in Table 1, the abbreviated symbols of the NIR dye (Aa) are shown together). In Table 1, in the case where $R^1$ to $R^6$ are a group having a formula described above, the symbol of the formula is indicated. In all compounds shown in Table 1, all of $R^1$ to $R^6$ are identical between the left and right sides of the formula. In Table 1, the alkyl group represented by —$C_nH_{2n+1}$ (n is an integer of 3 or more) indicates a linear alkyl group.

TABLE 1

| Abbreviated Symbol of NTR Dye (Aa) | $R^1$ | $R^2$ | $R^3$ | $R^4$ | $R^5$ | $R^6$ |
|---|---|---|---|---|---|---|
| A1 | H | (1a) | (1a) | H | (11) | |
| A2 | H | (1a) | (1a) | H | —$C_3H_7$ | —$C_3H_7$ |
| A3 | H | (1a) | (1a) | H | (1a) | (1a) |
| A4 | —$C_{12}H_{25}$ | —$C_8H_{17}$ | —$C_3H_{17}$ | H | (11) | |
| A5 | H | (P1) | (P1) | H | (1a) | (1a) |
| A6 | H | (P6) | (P6) | H | (1a) | (1a) |
| A7 | H | (3a) | (3a) | H | (1a) | (1a) |
| A8 | H | (3a) | (3a) | H | (11) | |
| A9 | H | (9a) | (9a) | H | (1a) | (1a) |
| A10 | H | (9a) | (9a) | H | (11) | |
| A11 | H | (N1) | (N1) | H | (1a) | (1a) |
| A12 | H | (1a) | (1a) | H | (3a) | (3a) |
| A13 | H | (3a) | (3a) | H | (3a) | (3a) |
| A14 | H | (9a) | (9a) | H | (3a) | (3a) |
| A15 | H | (P1) | (P1) | H | (3a) | (3a) |
| A16 | H | (P6) | (P6) | H | (3a) | (3a) |

(NIR Dye (Ab))

The NIR dye (Ab) is a compound of the NIR dye (A) in which $R^{12}$ and $R^{13}$ are not combined.

[Chem. 7]

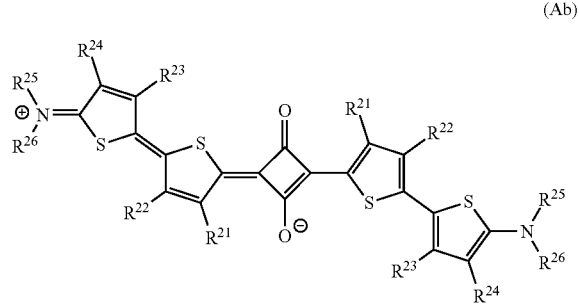

(Ab)

In formula (Ab), each of $R^{21}$ to $R^{24}$ is independently a hydrogen atom, a halogen atom, a hydroxyl group, or an alkyl, aryl or alaryl group which may include a substituent, may contain an unsaturated bond, an oxygen atom, an ester bond, an amide bond, or a thioamide bond between carbon-carbon atoms, and may have an oxygen atom, an ester bond, an amide bond, or a thioamide bond on the terminal bonded to the thiophene ring. Each of the pairs $R^{21}$ and $R^{22}$, and $R^{23}$ and $R^{24}$ may combine with one another to form a monocyclic ring or a polycyclic ring in which from 2 to 4 rings are fused, and in this case, a hydrogen atom bonded to the ring may be substituted by a substituent. $R^{22}$ and $R^{23}$ do not combine with one another. $R^{25}$ and $R^{26}$ have the same meanings as $R^{15}$ and $R^{16}$ in formula (A).

$R^{21}$ in formula (Ab) corresponds to $R^{11}$ in formula (A) and can be the same atom or group as $R^{11}$. $R^{22}$ in formula (Ab) corresponds to $R^{12}$ in formula (A) and can be the same atom or group as $R^{12}$. In the NIR dye (Ab), in view of ease of production, $R^{21}$ and $R^{22}$ are preferably a hydrogen atom or an alkyl group having a carbon number of 1 to 8, more preferably a hydrogen atom.

In the NIR dye (Ab), it is also preferred that each of $R^{21}$ and $R^{22}$ is independently a hydroxyl group or an alkyl, aryl or alaryl group which may include a substituent, may contain an unsaturated bond, an oxygen atom, an ester bond, an amide bond, or a thioamide bond between carbon-carbon atoms, and may have an oxygen atom, an ester bond, an amide bond, or a thioamide bond on the terminal bonded to the thiophene ring.

In the case where each of $R^{21}$ and $R^{22}$ is independently an alkyl, aryl or alaryl group having an oxygen atom or a thioamide bond on the terminal bonded to the thiophene ring, the NIR dye (Ab) can acquire optical characteristics having a maximum absorption wavelength on the longer wavelength side. In this case, the carbon number of the alkyl group is preferably from 1 to 20, more preferably from 1 to 10. The carbon number of the aryl group is preferably from 4 to 16, more preferably from 4 to 10. The carbon number of the alaryl group is preferably from 5 to 36, more preferably from 5 to 20.

Each of $R^{21}$ and $R^{22}$ is more preferably, for example, a group selected from a hydrogen atom, —NH—C(=S)—$CH_3$, a methyl group, an ethyl group, and a methoxy group.

$R^{23}$ and $R^{24}$ in formula (Ab) correspond respectively to $R^{13}$ and $R^{14}$ in formula (A) and can be the same atom or group as $R^{13}$ and $R^{14}$. In the NIR dye (Ab), in view of visible light transmission or solubility in a resin and a solvent, each of $R^{23}$ and $R^{24}$ is independently, preferably a linear, branched or cyclic alkyl group having a carbon number of 1 to 20, which may contain an oxygen atom between carbon-carbon atoms. The carbon number of the alkyl group is preferably from 1 to 12 in the case of a linear alkyl group, preferably from 3 to 10 in the case of a branched alkyl group, and preferably from 5 to 10 in the case of a cyclic alkyl group. $R^{24}$ is more preferably, for example, a group selected from the groups (1a) to (15a), still more preferably group (1a).

In view of ease of production, each of $R^{23}$ and $R^{24}$ is independently, preferably a hydrogen atom or an alkyl group having a carbon number of 1 to 8, more preferably a hydrogen atom.

$R^{25}$ and $R^{26}$ in formula (Ab) are the same as $R^{15}$ and $R^{16}$ in formula (A), including preferred embodiments.

In the NIR dye (Ab), it is preferred that out of $R^{21}$ to $R^{26}$, 2 or more members, more preferably 3 or more members, still more preferably all of 4 members, selected from $R^{23}$, $R^{24}$, $R^{25}$ and $R^{26}$ are a linear or branched alkyl group having a carbon number of 3 to 20, which may contain an oxygen atom between carbon-carbon atoms. In this case, the NIR dye (Ab) can have high visible light transmission or high solubility in a resin and a solvent.

Examples of the NIR dye (Ab) include, more specifically, those where $R^{21}$ to $R^{26}$ are the compounds shown in Table 2 below (in Table 2, the abbreviated symbols of the NIR dye (Ab) are shown together). In Table 2, in the case where $R^{21}$ to $R^{26}$ are a group having a formula described above, the symbol of the formula is indicated. In all compounds shown in Table 2, all of $R^{21}$ to $R^{26}$ are identical between the left and right sides of the formula.

TABLE 2

| Abbreviated Symbol of NIR Dye (Ab) | $R^{21}$ | $R^{22}$ | $R^{23}$ | $R^{24}$ | $R^{25}$ | $R^{26}$ |
|---|---|---|---|---|---|---|
| A21 | H | H | H | H | (1a) | (1a) |
| A22 | H | $CH_3$ | H | H | (1a) | (1a) |
| A23 | H | $C_2H_5$ | H | H | (1a) | (1a) |
| A24 | H | $OCH_3$ | H | H | (1a) | (1a) |
| A25 | H | $C_2H_5$ | H | H | (4a) | (4a) |
| A26 | H | $OCH_3$ | H | H | (4a) | (4a) |
| A27 | NHC(=S)$CH_3$ | H | H | H | (1a) | (1a) |

In the above, the chemical structure of the NIR dye (A) is described. In the NIR dye (A) having such a chemical structure, when the concentration is adjusted such that the transmittance of light with a maximum absorption wavelength $\lambda_{max(A)}$ in a dichloromethane solution becomes 10%, the average transmittance of light with a wavelength within 400 nm to 500 nm is preferably 90% or more, more preferably 92% or more, still more preferably 94% or more.

In addition, in the NIR dye (A), when the concentration is adjusted such that the transmittance of light with a maximum absorption wavelength $\lambda_{max(A)}$ in a dichloromethane solution becomes 10%, the average transmittance of light with a wavelength within 500 nm to 600 nm is preferably 90% or more, more preferably 92% or more, still more preferably 95% or more.

Furthermore, in the NIR dye (A), when the concentration is adjusted such that the transmittance of light with a maximum absorption wavelength $\lambda_{max(A)}$ in a dichloromethane solution becomes 10%, the average transmittance of light with a wavelength within 600 nm to 700 nm is preferably 90% or more, more preferably 92% or more, still more preferably 95% or more.

In the NIR dye (Aa), out of the NIR dyes (Aa) shown in Table 1, from the viewpoint that the light resistance can be maintained high, NIR dye (A3), NIR dye (A7), NIR dye (A9), NIR dye (A12), NIR dye (A13), NIR dye (A14), etc. are preferred. In addition, in view of the solubility in a resin and a solvent, NIR dye (A1), NIR dye (A2), NIR dye (A3), NIR dye (A5), NIR dye (A6), NIR dye (A7), NIR dye (A9), NIR dye (A11), NIR dye (A12), NIR dye (A16), etc. are preferred. Furthermore, in view of ease of production, NIR dye (A1), NIR dye (A5), NIR dye (A8), NIR dye (A15), etc. are preferred.

In the NIR dye (Ab), out of the NIR dyes (Ab) shown in Table 2, in view of the solubility in a resin and a solvent, NIR dye (A22), NIR dye (A23), NIR dye (A24), etc. are preferred. In addition, in view of ease of production, NIR dye (A21), NIR dye (A22), NIR dye (A23), etc. are preferred.

Owing to the NIR dye (A), for example, absorption characteristics that in the absorption spectrum at a wavelength of 400 nm to 1,200 nm as measured by dissolving the dye in dichloromethane, the maximum absorption wavelength $\lambda_{max(A)}$ is within 800 nm to 1,000 nm are obtained. In addition, when the range is limited, absorption characteristics that the maximum absorption wavelength $\lambda_{max(A)}$ is within 850 nm to 980 nm are also obtained. Such absorption characteristics are favorable characteristics as an absorption layer used in an ambient near-infrared light sensor requiring an absorption maximum at 850 nm to 1,050 nm.

The NIR dye (A) has good solubility in an organic solvent and good compatibility with a transparent resin. As a result, even if the absorption layer is thinned, the layer can have excellent spectral transmission characteristics, and the optical filter can be made thinner, such that a thermal expansion of the absorption layer due to heating can be reduced. Accordingly, for example, in heat treatment for forming a functional layer stacked on the absorption layer, such as reflection layer or antireflection layer, occurrence of cracking, etc. in these layers can be prevented.

The NIR dye (A) can be produced, for example, by reacting 3,4-dihydroxy-3-cyclobutene-1,2-dione (squaric acid) and a thiophene derivative having a terminal amino group capable of forming a structure represented by formula (A) by bonding to the squaric acid. For example, in the case where the NIR dye (A) has a bilaterally symmetrical structure, 2 equivalents of a thiophene derivative having a desired structure may be reacted with 1 equivalent of a squaric acid in the above-described range.

As a specific example, a reaction route to obtain the NIR dye (Aa) is shown below. In the following scheme (F1), the squaric acid is denoted by (s). In scheme (F1), $R^1$ to $R^6$ have the same meanings as in formula (Aa).

According to scheme (F1), iodine is introduced into the position of introduction of the amino group of a cyclopentadithiophene derivative having desired substituents ($R^1$, $R^2$, $R^3$, $R^4$) in the presence of tertiary butyllithium to obtain an intermediate A-1. The halogen group introduced into the above-described amino group introduction position may also be bromine, etc.

A tertiary amine having desired substituents ($R^5$, $R^6$) is reacted with the intermediate A-1 to obtain, as an intermediate A-2, a cyclopentadithiophene derivative having desired substituents ($R^1$, $R^2$, $R^3$, $R^4$, $NR^5R^6$). Here, the method for introducing the tertiary amine into the intermediate A-1 is not limited to the method above. The NIR dye (Aa) is obtained by reacting 2 equivalents of the intermediate A-2 with 1 equivalent of the squaric acid (s).

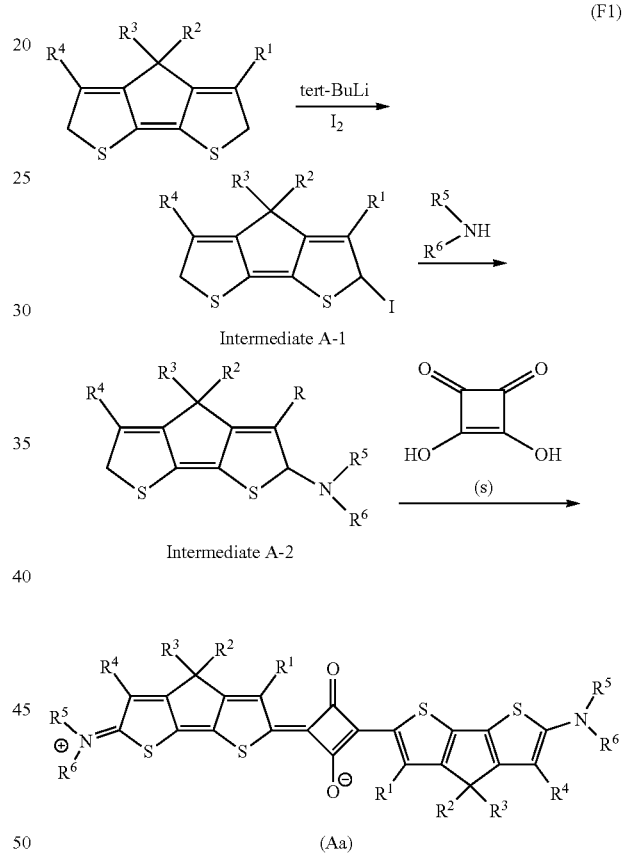

As a specific example, a reaction route to obtain the NIR dye (Ab) is shown below. In the following scheme (F2), the squaric acid is denoted by (s). In scheme (F2), $R^{21}$ to $R^{26}$ have the same meanings as in formula (Ab).

According to scheme (F2), a tertiary amine having substituents ($R^{25}$, $R^{26}$) is caused to act on a thiophene derivative A2-a having desired substituents ($R^{21}$, $R^{22}$, $R^{23}$, $R^{24}$) in the presence of a condensing agent, thereby obtaining a thiophene derivative A2-b having desired substituents ($R^{21}$, $R^{22}$, $R^{23}$, $R^{24}$, $R^2$, $R^{26}$). The method for introducing the tertiary amine into A2-a is not limited to the method above. A Lawesson's reagent is caused to act on A2-b to obtain a bithiophene derivative A2-c. The NIR dye (Ab) is obtained by reacting A2-c with a squaric acid.

[Chem. 9]

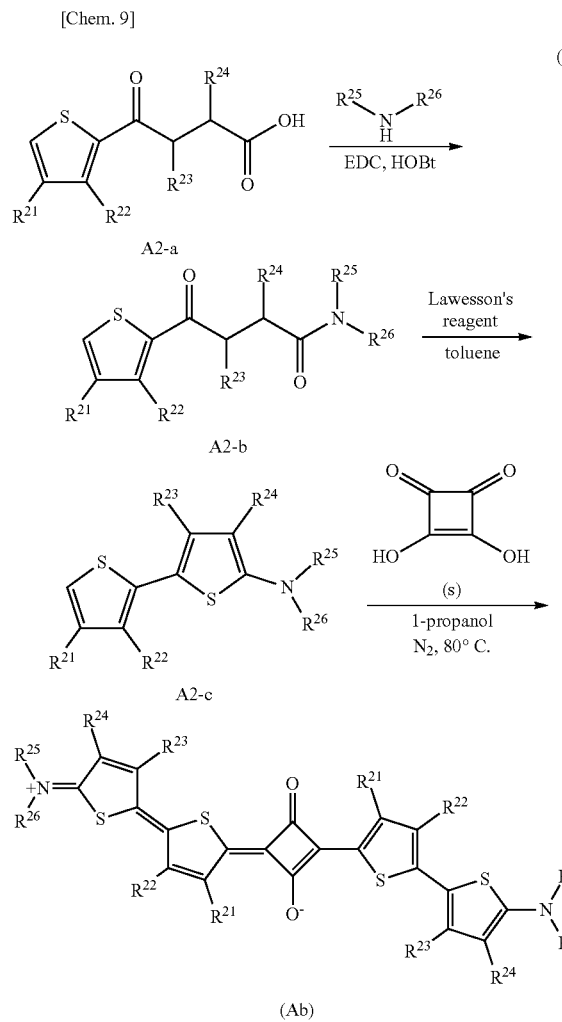

The usage of the NIR dye (A) of the present invention is not particularly limited. For example, the dye can be applied to an optical filter for blocking near-infrared light, among others, near-infrared light with relatively long wavelength. In addition, as described above, the dye can also be applied as an absorption layer used in an ambient light sensor.

<Optical Filter>

The optical filter of one embodiment of the present invention (hereinafter, sometimes referred to as the "present filter") includes an absorption layer containing the NIR dye (A) of the present invention and a resin.

The present filter may further have a reflection layer including a dielectric multilayer film, in addition to the absorption layer. In the following description, the "reflection layer" indicates a reflection layer including a dielectric multilayer film.

The present filter may further include a transparent substrate. In this case, the absorption layer is provided on a main surface of the transparent substrate. In the case where the present filter includes a transparent substrate, an absorption layer and a reflection layer, the absorption layer and the reflection layer are provided on a main surface of the transparent substrate. The present filter may include the absorption layer and the reflection layer on the same main surface or on different main surfaces of the transparent substrate. In the case of including the absorption layer and the reflection layer on the same main surface, the order of stacking them is not particularly limited.

The present filter may also include another functional layer. Examples of other functional layers include, for example, an antireflection layer to reduce a transmittance loss of visible light. Among others, in the case of employing a configuration where the absorption layer serves as an uppermost surface, a visible light transmittance loss is generated due to reflection at an interface between the absorption layer and the air and therefore, the antireflection layer is preferably provided on the absorption layer.

Next, configuration examples of the present filter are described by using the drawings. FIG. 1 is a cross-sectional diagram illustrating an optical filter 10A including an absorption layer 11. The absorption layer 11 can include a layer containing the NIR dye (A) and a resin. In the optical filter 10A, the absorption layer 11 can take a film or substrate form.

Figure 2:
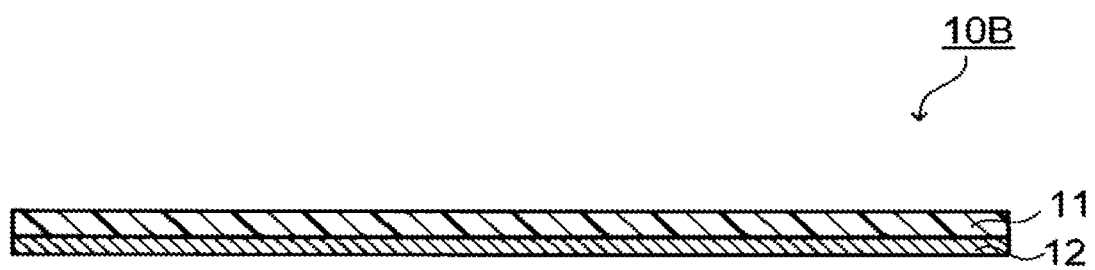
FIG. 2 is a cross-sectional view schematically illustrating another example of the optical filter of an embodiment.

FIG. 2 is a configuration example of an optical filter 10B including a reflection layer 12 on one main surface of the absorption layer 11. In the optical filter 10B, the absorption layer 11 can be composed of a layer containing the NIR dye (A) and a resin. Incidentally, the expression "including a reflection layer 12 on (over) one main surface of the absorption layer 11" is not limited to a case where the reflection layer 12 is provided in contact with the absorption layer 11, but also encompasses a case where another functional layer is provided between the absorption layer 11 and the reflection layer 12. The same applies to the following configurations.

Figure 3:
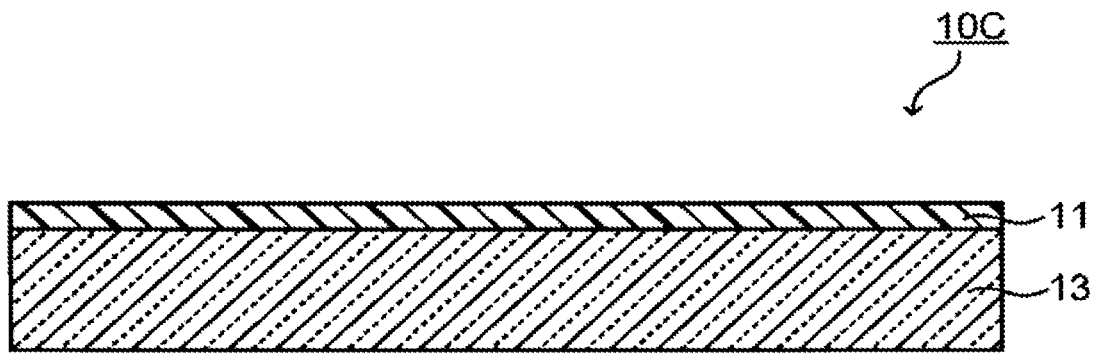
FIG. 3 is a cross-sectional view schematically illustrating another example of the optical filter of an embodiment.
Figure 4:
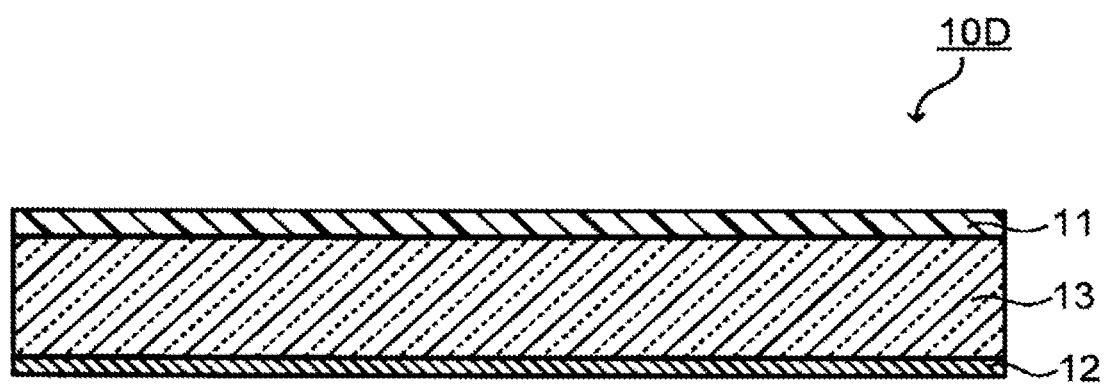
FIG. 4 is a cross-sectional view schematically illustrating another example of the optical filter of an embodiment.

FIG. 3 is a cross-sectional diagram schematically illustrating one example of the optical filter of an embodiment including a transparent substrate and an absorption layer. FIG. 4 is a cross-sectional diagram schematically illustrating one example of the optical filter of an embodiment including a transparent substrate, an absorption layer, and a reflection layer. The optical filter 10C includes a transparent substrate 13 and an absorption layer 11 disposed on one main surface of the transparent substrate 13. The optical filter 10D includes a transparent substrate 13, an absorption layer 11 disposed on one main surface of the transparent substrate 13, and a reflection layer 12 provided on the other main surface of the transparent substrate 13. In the optical filters 10C and 10D, the absorption layer 11 can be composed of a layer containing the NIR dye (A) and a resin.

Figure 5:
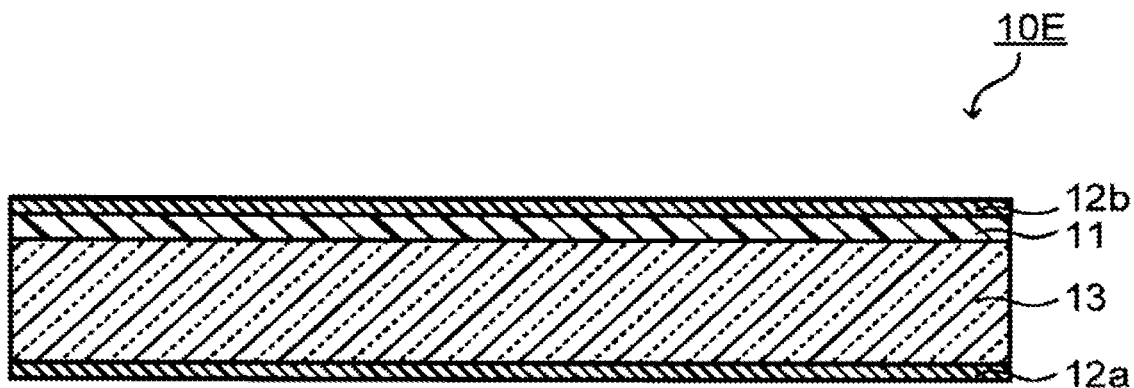
FIG. 5 is a cross-sectional view schematically illustrating another example of the optical filter of an embodiment.
Figure 6:
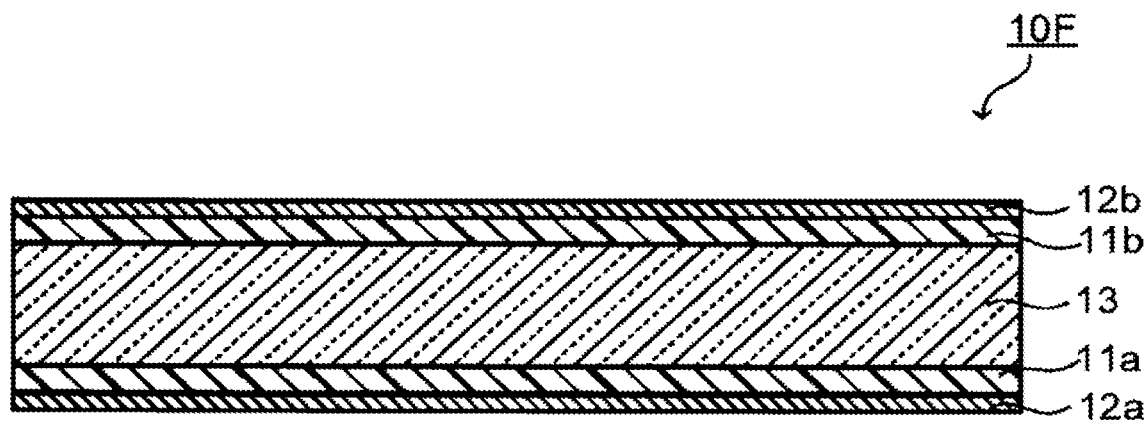
FIG. 6 is a cross-sectional view schematically illustrating another example of the optical filter of an embodiment.

FIG. 5 is a configuration example of the optical filter 10E including an absorption layer 11 on one main surface of a transparent substrate 13 and including reflection layers 12a and 12b on the other main surface of the transparent substrate 13 and on a main surface of the absorption layer 11, respectively. FIG. 6 is a configuration example of the optical filter 10F including absorption layers 11a and 11b on both main surfaces of a transparent substrate 13 respectively, and further including reflection layers 12a and 12b on main surfaces of the absorption layers 11a and 11b respectively.

In FIG. 5 and FIG. 6, the combined two reflection layers 12a and 12b may be the same or different. For example, the following configuration may be employed: the reflection layers 12a and 12b have a property of reflecting ultraviolet light and near-infrared light and transmitting visible light, the reflection layer 12a reflects ultraviolet light and light in the first near-infrared region, and the reflection layer 12b reflects ultraviolet light and light in the second near-infrared region.

Furthermore, in FIG. 6, two absorption layers 11a and 11b may be the same or different. In the case where the absorption layers 11a and 11b are different, for example, the absorption layers 11a and 11b may be a combination of a near-infrared absorbing layer and an ultraviolet absorbing layer or may be a combination of an ultraviolet absorbing layer and a near-infrared absorbing layer. The near-infrared absorbing layer can be composed of a layer containing the NIR dye (A) and a resin.

Figure 7:
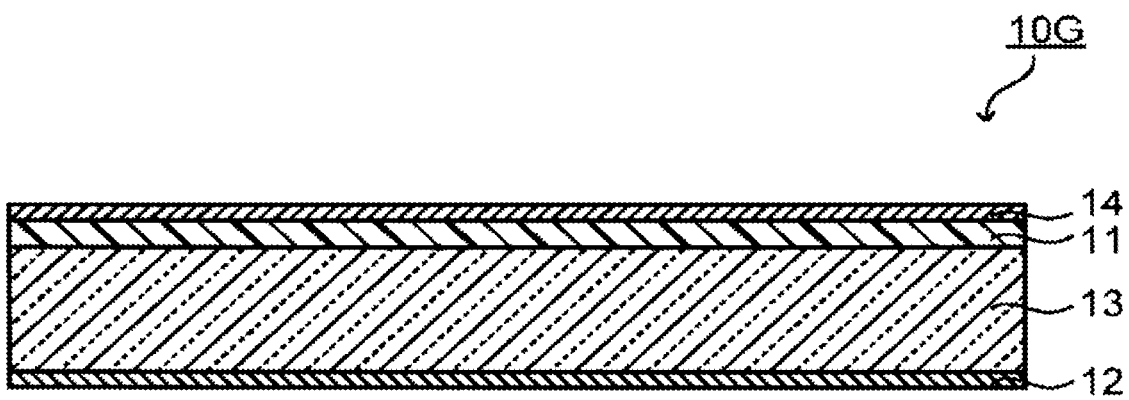
FIG. 7 is a cross-sectional view schematically illustrating another example of the optical filter of an embodiment.

FIG. 7 is a configuration example of the optical filter 10G including an antireflection layer 14 on a main surface of the absorption layer 11 of the optical filter 10D illustrated in FIG. 4. The antireflection layer 14 may be configured to cover not only the outermost surface of the absorption layer 11 but also the entire side surface of the absorption layer 11. In this case, the moisture-proof effect of the absorption layer 11 is enhanced.

The absorption layer, reflection layer, transparent substrate and antireflection layer are described below.

(Absorption Layer)

The absorption layer contains one kind or two or more kinds of the NIR dye (A). As long as the effects of the present invention are not impaired, the absorption layer may further contain an NIR dye (hereinafter, referred to as another NIR dye) other than the NIR dye (A).

The content of the NIR dye (A) in the absorption layer is, in terms of a total amount of the NIR dye (A) and another NIR dye, preferably from 0.1 to 30 parts by mass per 100 parts by mass of the resin. In the case where the content is 0.1 parts by mass or more, a desired near-infrared absorbing ability is obtained, and in the case where the content is 30 parts by mass or less, a reduction of the near-infrared absorbing ability, an increase in the haze value, etc. are prevented. In addition, the total content of the NIR dye (A) and another NIR dye is more preferably from 0.5 to 25 parts by mass, still more preferably from 1 to 20 parts by mass.

Examples of the another NIR dye include an NIR dye having a maximum absorption wavelength on the shorter wavelength side than the maximum absorption wavelength $\lambda_{max(A)}$ of the NIR dye (A), specifically, an NIR dye (AII) having a maximum absorption wavelength $\lambda_{max(AII)}$ at 660 nm or more and not more than the maximum absorption wavelength $\lambda_{max(A)}$ of the NIR dye (A)-30 nm. In the case of obtaining a wider absorption width by using two or more NIR dyes, the maximum absorption wavelength $\lambda_{max(AII)}$ of the NIR dye (AII) is preferably not more than $\lambda_{max(A)}$-50 nm, more preferably not more than $\lambda_{max(A)}$-80 nm, still more preferably not more than $\lambda_{max(A)}$-100 nm.

Furthermore, examples of the other NIR dye include an NIR dye having a maximum absorption wavelength on the longer wavelength side than the maximum absorption wavelength $\lambda_{max(A)}$ of the NIR dye (A), specifically, an NIR dye (AIII) having a maximum absorption wavelength $\lambda_{max(AIII)}$ at not less than the maximum absorption wavelength $\lambda_{max(A)}$ of the NIR dye (A)+30 nm and 1,100 nm or less. In the case of obtaining a wider absorption width by using two or more NIR dyes, the maximum absorption wavelength $\lambda_{max(AIII)}$ of the NIR dye (AIII) is preferably not less than $\lambda_{max(A)}$+50 nm, more preferably not less than $\lambda_{max(A)}$+80 nm, still more preferably not less than $\lambda_{max(A)}$+100 nm.

The maximum absorption wavelength of each NIR dye above is the maximum absorption wavelength as measured in a dichloromethane solution.

Examples of the NIR dye (AII) include dyes having a maximum absorption wavelength $\lambda_{max(AII)}$ in the range above, out of a cyanine-based compound, a phthalocyanine-based compound, a naphthalocyanine-based compound, a dithiol metal complex-based compound, a diimonium-based compound, a polymethine-based compound, a phthalide compound, a naphthoquinone-based compound, an anthraquinone-based compound, an indophenol-based compound, and a squarylium-based compound.

Examples of the NIR dye (AIII) include dyes having a maximum absorption wavelength $\lambda_{max(AIII)}$ in the range above, out of a cyanine-based compound, a phthalocyanine-based compound, a naphthalocyanine-based compound, a dithiol metal complex-based compound, a diimonium-based compound, a polymethine-based compound, a phthalide compound, a naphthoquinone-based compound, an anthraquinone-based compound, an indophenol-based compound, and a squarylium-based compound. With respect to each of the NIR dye (AII) and the NIR dye (AIII), one dye may be used alone, or two or more dyes may be mixed and used.

The absorption layer contains the NIR dye (A) and a resin and, typically, is a layer or (resin) substrate where the NIR dye (A) is uniformly dissolved or dispersed in the resin. The resin is usually a transparent resin, and the absorption layer may contain another NIR dye, in addition to the NIR dye (A). Furthermore, the absorption layer may contain a dye other than an NIR dye, particularly, may contain a UV dye.

Examples of the UV dye include, specifically, oxazole-based, merocyanine-based, cyanine-based, naphthalimide-based, oxadiazole-based, oxazine-based, oxazolidine-based, naphthalic acid-based, styryl-based, anthracene-based, cyclic carbonyl-based, triazole-based dyes, etc. Among these, oxazole-based and merocyanine-based dyes are preferred. In addition, as the UV dye, one dye may be used alone in the absorption layer, or two or more dyes may be used in combination.

Examples of the transparent resin include, for example, an acrylic resin, an epoxy resin, an ene-thiol resin, a polycarbonate resin, a polyether resin, a polyarylate resin, a polysulfone resin, a polyethersulfone resin, a polyparaphenylene resin, a polyarylene ether phosphine oxide resin, a polyimide resin, a polyamide-imide resin, a polyolefin resin, a cyclic olefin resin, and a polyester resin such as polyethylene terephthalate resin and polyethylene naphthalate resin. One of these resins may be used alone, or two or more thereof may be mixed and used.

In view of transparency, solubility of the NIR dye (A) and heat resistance, the transparent resin is preferably a resin having a high glass transition point (Tg). Specifically, one or more resins selected from the group consisting of a polyester resin, a polycarbonate resin, a polyethersulfone resin, a polyarylate resin, a polyimide resin, and an epoxy resin are preferred, and one or more resins selected from the group consisting of a polyester resin and a polyimide resin are more preferred.

As long as the effects of the present invention are not impaired, the absorption layer may further contain an optional component such as adhesion imparting agent, color tone correcting dye, leveling agent, antistatic agent, heat stabilizer, light stabilizer, antioxidant, dispersing agent, flame retardant, lubricant and plasticizer.

The absorption layer can be formed by dissolving or dispersing dyes containing the NIR dye (A), a resin or raw material components of the resin, and if necessary, each component to be blended, in a solvent to prepare a coating liquid, applying the coating liquid onto a base material, subjecting the coating to drying and furthermore, if necessary, to curing. The base material may be a transparent substrate optionally included in the present filter or a releasable base material used only when forming the absorption layer. In addition, the solvent may be any dispersion medium or solvent as long as stable dispersion or solution is ensured.

Furthermore, the coating liquid may contain a surfactant for remedying, e.g., voids due to microbubbles, dents due to adhesion of foreign matter, etc., or cissing in the drying step. In addition, for applying the coating liquid, for example, an immersion coating method, a cast coating method, or a spin coating method, etc. can be used. The coating liquid applied onto the base material is then dried to form the absorption layer. Furthermore, in the case where the coating liquid contains raw material components of a resin, a curing treatment such as thermal curing or photocuring, etc. is further performed.

In addition, the absorption layer may also be produced in a film shape by extrusion molding, and this film may be stacked on another member and integrated by thermocompression, etc. For example, in the case where the present filter includes a transparent substrate, the film may be stuck to the transparent substrate.

The present filter may include two or more absorption layers. In the case where the absorption layer includes two or more layers, each layer may be the same or different. In the case of including two or more absorption layers, examples of the absorption layers include a configuration where one layer is a near-infrared absorbing layer including a resin containing an NIR dye and another layer is an ultraviolet absorbing layer including a resin containing a UV dye. In addition, the absorption layer itself may be a substrate (resin substrate).

In the present filter, the thickness of the absorption layer is preferably from 0.1 μm to 100 μm. In the case where the absorption layer includes a plurality of layers, the total thickness of each layer is preferably from 0.1 μm to 100 μm. If the thickness is less than 0.1 μm, desired optical characteristics may not be sufficiently exhibited, and if the thickness exceeds 100 μm, the flatness of the layer is reduced, giving rise to a concern that the in-plane dispersion of the absorption factor may occur. The thickness of the absorption layer is more preferably from 0.3 μm to 50 μm. Furthermore, in the case of including other functional layers such as reflection layer or antireflection layer, if the thickness of the absorption layer is too large, cracking, etc. may occur depending on the material. Therefore, the thickness of the absorption layer is still more preferably from 0.3 μm to 10 μm.

(Transparent Substrate)

In the present filter, a transparent substrate is an optional constituent element. In the case where the present filter includes a transparent substrate, the thickness of the transparent substrate is preferably from 0.03 mm to 5 mm, and in view of thinning, the thickness is more preferably from 0.05 mm to 1 mm. As the material of the transparent substrate, a glass, a (birefringent) crystal, or a resin can be used, as long as the material transmits visible light.

Examples of the glass for the transparent substrate include an absorbing glass (near-infrared absorbing glass substrate) in which CuO, etc. is added to a fluorophosphate-based glass or a phosphate-based glass, etc., a soda lime glass, a borosilicate glass, an alkali-free glass, a quartz glass, etc. The "phosphate-based glass" encompasses a silicophosphate glass in which part of the skeleton of the glass is constituted by $SiO_2$.

In the case where the transparent substrate is a fluorophosphate-based glass, the glass preferably contains, in cation %, $P^{5+}$: from 20% to 45%, $Al^{3+}$: from 1% to 25%, $R^+$: from 1% to 30% (provided that $R^+$ is at least one of $Li^+$, $Na^+$, and $K^+$, and the value shown in the above is a total value of each content rate), $Cu^{2+}$: from 1% to 20%, and $R^{2+}$: from 1% to 50% (provided that $R^{2+}$ is at least one of $Mg^{2+}$, $Ca^{2+}$, $Sr^{2+}$, $Ba^{2+}$, and $Zn^{2+}$, and the value shown in the above is a total value of each content rate), and preferably contains, in anion %, $F^-$: from 10% to 65% and $O^{2-}$: from 35% to 90%.

In the case where the transparent substrate is a phosphate-based glass, the glass preferably contains, in mass %, $P_2O_5$: from 30% to 80%, $Al_2O_3$: from 1% to 20%, $R_2O$: from 0.5% to 30% (provided that $R_2O$ is at least one of $Li_2O$, $Na_2O$, and $K_2O$, and the value shown in the above is a total value of each content rate), CuO: from 1% to 12%, RO: from 0.5% to 40% (provided that RO is at least one of MgO, CaO, SrO, BaO, and ZnO, and the value shown in the above is a total value of each content rate).

Examples of the commercial product include NF-50E, NF-50EX, NF-50T, NF-50TX, etc. (manufactured by AGC Inc., trade names), BG-60, BG-61, etc. (both manufactured by Schott AG, trade names), CD5000 (manufactured by HOYA Corporation, trade name), etc.

The above-described CuO-containing glass may further contain a metal oxide. For example, in the case where one member or two or more members of $Fe_2O_3$, $MoO_3$, $WO_3$, $CeO_2$, $Sb_2O_3$, $V_2O_5$, etc. are contained as the metal oxide, the CuO-containing glass has ultraviolet absorption characteristics. With respect to the contents of these metal oxides, it is preferable to contain, per 100 parts by mass of the CuO-containing glass, at least one metal oxide selected from the group consisting of $Fe_2O_3$, $MoO_3$, $WO_3$ and $CeO_2$, in an amount of $Fe_2O_3$: from 0.6 to 5 parts by mass, $MoO_3$: from 0.5 to 5 parts by mass, $WO_3$: from 1 to 6 parts by mass, and $CeO_2$: from 2.5 to 6 parts by mass, two metal oxides of $Fe_2O_3$ and $Sb_2O_3$ in an amount of $Fe_2O_3$: from 0.6 to 5 parts by mass+$Sb_2O_3$: from 0.1 to 5 parts by mass, or two metal oxides of $V_2O_5$ and $CeO_2$ in an amount of $V_2O_5$: from 0.01 to 0.5 parts by mass+$CeO_2$: from 1 to 6 parts by mass.

Examples of the transparent resin for the transparent substrate include an acrylic resin, an epoxy resin, an enethiol resin, a polycarbonate resin, a polyether resin, a polyarylate resin, a polysulfone resin, a polyethersulfone resin, a polyparaphenylene resin, a polyarylene ether phosphine oxide resin, a polyimide resin, a polyamide-imide resin, a polyolefin resin, a cyclic olefin resin, and a polyester resin such as polyethylene terephthalate resin and polyethylene naphthalate resin. One of these resins may be used alone, or two or more thereof may be mixed and used.

(Reflection Layer)

In the present filter, a reflection layer is an optional constituent element. The reflection layer includes a dielectric multilayer film and has a function of blocking light in a specific wavelength range. Examples of the reflection layer include those having wavelength selectivity of transmitting visible light and reflecting mainly light having a wavelength other than the light blocking range of the absorption layer. In this case, the reflection range of the reflection layer may include the light blocking range in the near-infrared region of the absorption layer. The reflection layer is not limited to those having the above-described characteristics and may be appropriately designed in accordance with the light blocking specification in a predetermined wavelength region.

In the case where the present filter includes a reflection layer, the layer preferably has reflection characteristics such that the transmittance of light at the maximum absorption wavelength $\lambda_{max(A)}$ of the NIR dye (A) is 1% or less. Due to this transmittance, in the present filter, a high light blocking effect (high OD value) is synergistically obtained at the maximum absorption wavelength $\lambda_{max(AII)}$ of the NIR dye (A).

The present filter may include one layer or two or more layers as the reflection layer. In the case where the reflection layer includes two or more layers, each layer may be the same or different. In the case where the reflection layer has a configuration of two or more layers, the reflection layer may have a combination where one layer is a near-infrared blocking layer that blocks at least near-infrared light, particularly, has the above-described reflection characteristics and another layer is an ultraviolet blocking layer that blocks at least ultraviolet light.

The reflection layer includes a dielectric multilayer film in which a dielectric film with a low refractive index (low-refractive-index film) and a dielectric film with a high refractive index (high-refractive-index film) are alternately stacked. Examples of the material of the high-refractive-index film include $Ta_2O_5$, $TiO_2$, and $Nb_2O_5$, and among these, $TiO_2$ is preferred from the viewpoint of reproducibility, stability, etc. in terms of film formation, refractive index, etc. Examples of the material of the low-refractive-index film include $SiO_2$, $SiO_xN_y$, etc., and $SiO_2$ is preferred from the viewpoint of reproducibility, stability, profitability, etc. in film formation. In addition, the film thickness of the reflection layer is preferably from 2 μm to 10 μm.

(Antireflection Layer)

Examples of the antireflection layer include a dielectric multilayer film, an intermediate-refractive-index medium, and a moth-eye structure in which the refractive index gradually changes. Among others, use of a dielectric multilayer film is preferred from the viewpoint of high light utilization efficiency and productivity.

Since the present filter includes an absorption layer containing the NIR dye (A), excellent light blocking property in the long wavelength range of near-infrared light can be realized and at the same time, high visible light transmission can be realized. The present filter can be used, for example, in an imaging device such as digital still camera, an ambient light sensor, etc.

The imaging device using the present filter includes a solid-state image sensor, an imaging lens, and the present filter. The present filter can be used in the state of, for example, being disposed between the imaging lens and the solid-state image sensor or being stuck directly to the solid-state image sensor, imaging lens, etc. of the imaging device by means of an adhesive layer.

EXAMPLES

The present invention is described more specifically below by referring to Examples. First, in Ex. 1 to Ex. 7, NIR dyes (A1) to (A7) having structures shown in Table 1, which are the NIR dye (Aa), were produced as follows. Furthermore, in Ex. 8, NIR dye (Acf) of Comparative Example having a different structure from the NIR dye (A) was produced. Additionally, in Ex. 9 to Ex. 15, NIR dyes (A21) to (A27) having structures shown in Table 2, which are the NIR dye (Ab), were produced as follows. Optical characteristics of each of the obtained NIR dyes were measured and evaluated.

In addition, Example (Ex. 16) of the optical filter including an absorption layer containing the obtained NIR dye is described.

In each of the following Examples, the structure of the produced NIR dye was confirmed by 1H NMR. Also, for the evaluation of optical characteristics of the NIR dye and the absorption layer containing the dye, an ultraviolet-visible spectrophotometer (manufactured by Hitachi High Technologies Co., Ltd., Model U-4150) was used.

Ex. 1

NIR Dye (A1) was synthesized according to the reaction route shown below.

[Chem. 10]

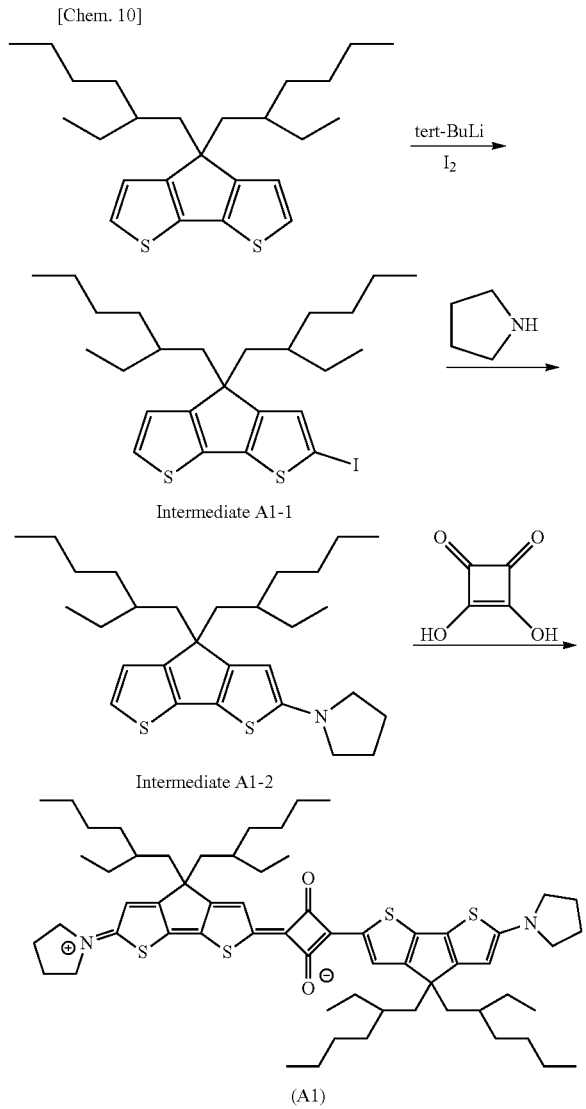

<Step A1-1>

4,4-Bis(2-ethylhexyl)-4H-cyclopenta[1,2-b:5,4-b']dithiophene (4.50 g, 11.2 mmol) was put into a flask and dissolved in anhydrous diethyl ether (23 ml) under a nitrogen atmosphere. The resulting solution was cooled to 0° C. and a hexane solution (7.34 ml, 11.2 mmol) of 1.6 M tertiary butyllithium was added dropwise thereto, followed by stirring at room temperature for 1 hour. The resulting mixture was cooled to 0° C. and an anhydrous diethyl solution (40 ml) in which iodine (2.98 g, 11.2 mmol) had been dissolved was added dropwise to the mixture, followed by stirring at room temperature for 1 hour. After the completion of reaction, the reaction solution was poured into ice water and extracted with diisopropyl ether. The obtained organic layer was washed with saturated brine, followed by removal of the solvent, and Intermediate A1-1 (5.55 g, yield: 94%) was obtained by silica gel column chromatography (hexane).

<Step A1-2>

Intermediate A1-1 (2.00 g, 3.78 mmol) obtained in step A1-1, potassium phosphate (1.60 g, 7.56 mmol), copper powder (0.0240 g, 0.378 mmol), and pyrrolidine (0.402 g, 5.65 mmol) were put in a flask and dissolved in deanol (3.78 ml) under a nitrogen atmosphere, followed by stirring at 60° C. a whole day and night. After the completion of reaction, the reaction solution was poured into water (4 ml) and extracted with diisopropyl ether. The solvent of the obtained organic layer was removed, and Intermediate A1-2 (1.69 g, yield: 95%) was obtained by silica gel column chromatography (hexane:triethylamine=100:3).

<Step A1-3>

Intermediate A1-2 (1.69 g, 3.59 mmol) obtained in step A1-2 and 3,4-dihydroxy-3-cyclobutene-1,2-dione (0.205 g, 1.80 mmol) were put in a flask and dissolved in a mixed solution of normal butanol (9 ml) and toluene (9 ml) under a nitrogen atmosphere, followed by stirring under reflux for 3 hours. After the completion of reaction, the solvent was removed, and NIR Dye (A1) (0.311 g, yield: 17%) was obtained by NH$_2$-silica gel chromatography (hexane:dichloromethane=1:1).

Ex. 2

NIR Dye (A2) was obtained in the same manner as in Ex. 1 except that in the production of NIR Dye (A1) of Ex. 1, dipropylamine was used in place of pyrrolidine in step A1-2.

[Chem. 11]

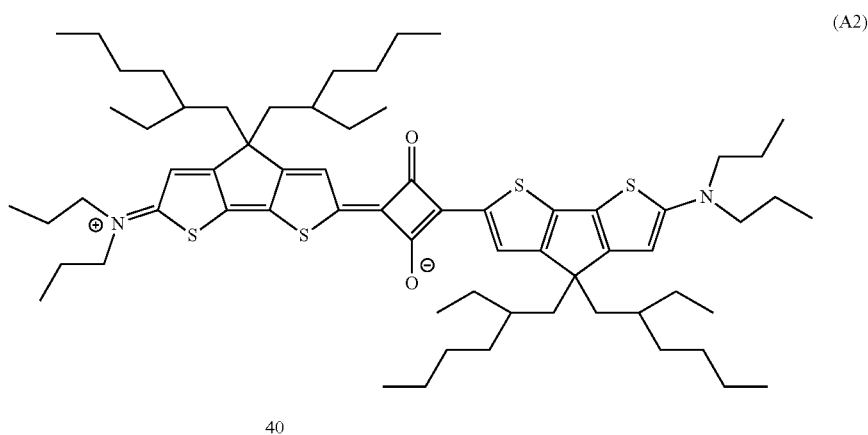

Ex. 3

NIR Dye (A3) was synthesized according to the reaction route shown below.

[Chem. 12]

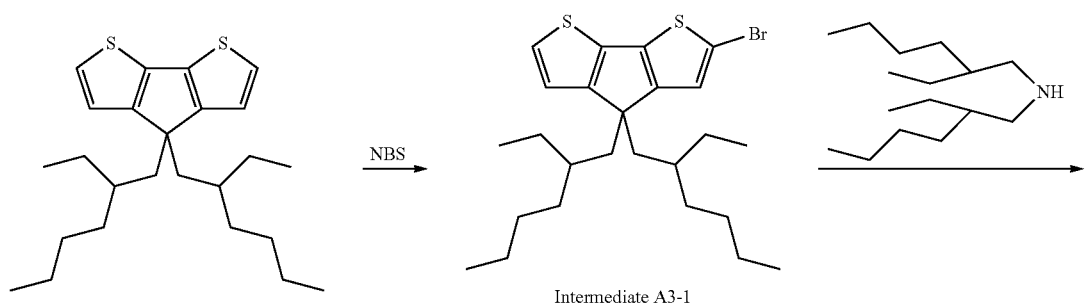

-continued

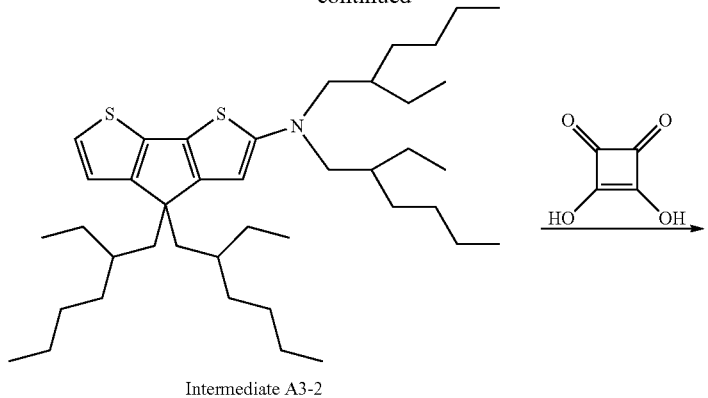

Intermediate A3-2

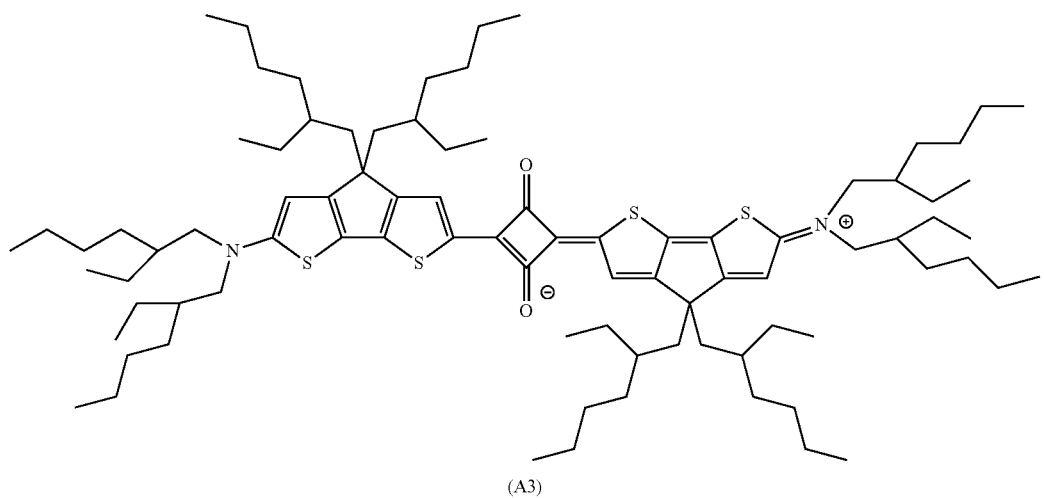

(A3)

<Step A3-1>

4,4-Bis(2-ethylhexyl)-4H-cyclopenta[1,2-b:5,4-b']dithiophene (3.00 g, 7.45 mmol) was put into a flask and dissolved in anhydrous dimethylformamide (7.5 ml) under a nitrogen atmosphere. The resulting solution was cooled to −15° C. and an anhydrous dimethylformamide solution (7.45 ml) in which N-bromosuccinimide (1.32 g, 7.45 mmol) had been dissolved was added dropwise thereto. The resulting mixture was stirred at room temperature for 30 minutes and then stirred at 60° C. for 5 hours. After the completion of reaction, the reaction solution was poured into ice water and extracted with diisopropyl ether. The obtained organic layer was washed with saturated brine, followed by removal of the solvent, and Intermediate A3-1 (3.69 g, yield: 100%) was obtained by silica gel column chromatography (hexane).

<Step A3-2>

Intermediate A3-1 (1.5 g, 4.15 mmol) obtained in step A3-1 and magnesium turnings (0.202 g, 8.30 mmol) were put into a flask and dissolved in anhydrous tetrahydrofuran (6 ml) under a nitrogen atmosphere. The resulting solution was refluxed for 3 hours and cooled to −40° C. In another flask, N-chlorosuccinimide (0.554 g, 4.15 mmol) was dissolved in anhydrous toluene (20 ml) under a nitrogen atmosphere, and bis-(2-ethylhexyl)amine (1.00 g, 4.15 mmol) was added thereto, followed by stirring for 20 minutes.

Tetraisopropyl orthotitanate (0.554 g, 4.15 mmol) was added dropwise to the mixed solution cooled to −40° C. and stirred for 5 minutes. After stirring, the mixed solution of N-chlorosuccinimide and bis-(2-ethylhexyl)amine was added dropwise, followed by stirring at room temperature for 3 hours. After the completion of reaction, a saturated aqueous potassium carbonate solution (8 ml) was added, and subsequently, the mixture was diluted with ethyl acetate and filtered. The resulting solution was extracted with ethyl acetate, and the obtained organic layer was washed with saturated brine. The solvent was removed, and Intermediate A3-2 (0.187 g, yield: 7.02%) was obtained by silica gel column chromatography (hexane:triethylamine=100:3).

<Step A3-3>

Intermediate A3-2 (0.18 g, 0.28 mmol) obtained in step A3-2 and 3,4-dihydroxy-3-cyclobutene-1,2-dione (0.016 g, 0.14 mmol) were put in a flask and dissolved in a mixed solution of normal butanol (1 ml) and toluene (1 ml) under a nitrogen atmosphere, followed by stirring under reflux for 3 hours. After the completion of reaction, the solvent was removed, and NIR Dye (A3) (0.022 g, yield: 12%) was obtained by $NH_2$-silica gel chromatography (hexane:dichloromethane=3:1).

Ex. 4
NIR Dye (A4) was synthesized according to the reaction route shown below.
[Chem. 13]
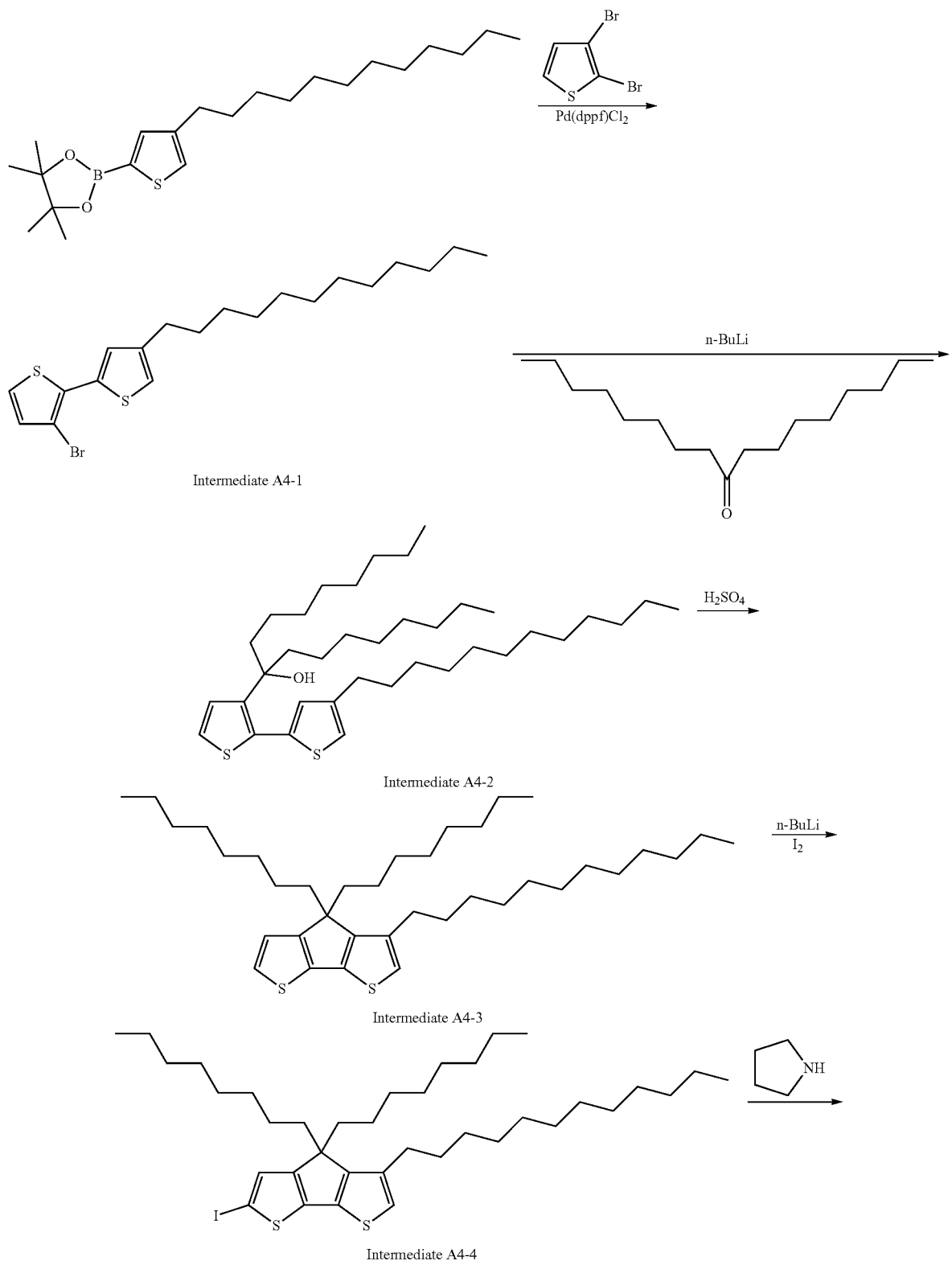

-continued

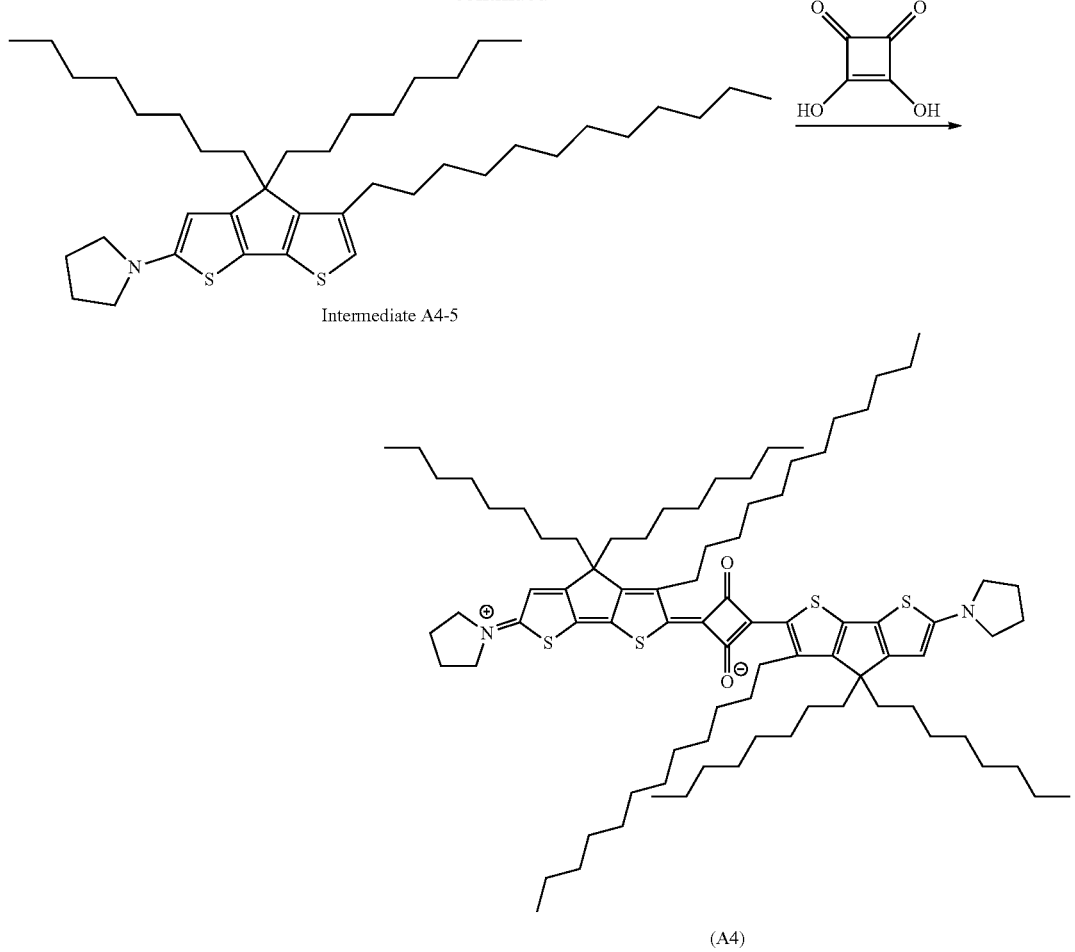

Intermediate A4-5

(A4)

<Step A4-1>

2,3-Dibromothiophene (5.01 g, 20.7 mmol) and 4-dodecyl-2-(4,4,5,5-tetramethyl-1,3,2-dioxaboran-2-yl) thiophene (8.59 g, 22.7 mmol) were put into a flask and dissolved in dioxane (250 ml) under a nitrogen atmosphere. Furthermore, an aqueous solution (41 ml) in which sodium carbonate (8.69 g, 82 mmol) had been dissolved was added, and [1,1'-bis(diphenylphosphino)ferrocene]palladium(II) dichloride dichloromethane adduct (0.340 g, 0.414 mmol) was added, followed by stirring at 100° C. for 4 hours. After the completion of reaction, 250 ml of water was added, and the mixture was extracted with diisopropyl ether. The obtained organic layer was washed with saturated brine, followed by removal of the solvent, and Intermediate A4-1 (3.04 g, yield: 36%) was obtained by silica gel column chromatography (hexane).

<Step A4-2>

Intermediate A4-1 (3.00 g, 7.26 mmol) obtained in step A4-1 was put into a flask and dissolved in diethyl ether (58 ml) under a nitrogen atmosphere. The resulting solution was cooled to −78° C., and a hexane solution (4.7 ml, 7.26 mmol) of 1.6 M normal butyllithium was added dropwise thereto, followed by stirring for 1 hour. Subsequently, a tetrahydrofuran solution (15 ml) in which 9-heptadecanone (1.85 g, 7.26 mmol) had been dissolved was added dropwise to the solution, and the resulting mixed solution was stirred at room temperature a whole day and night. After the completion of reaction, a saturated aqueous ammonium chloride solution (47 ml) was added thereto, and the mixture was extracted with diisopropyl ether. The obtained organic layer was washed with saturated brine, followed by removal of the solvent, and Intermediate A4-2 (3.69 g, yield: 86%) was obtained by silica gel column chromatography (hexane:ethyl acetate=4:1).

<Step A4-3>

Intermediate A4-2 (3.69 g, 6.26 mmol) obtained in step A4-2 was put into a flask and dissolved in hexane (81 ml) under a nitrogen atmosphere. Concentrated sulfuric acid (4.1 ml) was added dropwise to the solution, and the mixture was stirred at room temperature a whole day and night. After the completion of reaction, the solvent was removed, and Intermediate A4-3 (1.66 g, yield: 46%) was obtained by silica gel column chromatography (hexane).

<Step A4-4>

Intermediate A4-3 (1.66 g, 2.9 mmol) obtained in step A4-3 was put into a flask and dissolved in diethyl ether (6 ml) under a nitrogen atmosphere. The resulting solution was cooled to 0° C., and 1.6 M normal butyllithium (2.1 ml, 3.2 mmol) was added dropwise, followed by stirring at room temperature for 1 hour. Subsequently, the mixture was again cooled to 0° C., and a diethyl ether solution (24 ml) of iodine (0.81 g) was added dropwise thereto, followed by stirring at room temperature for 1 hour. After the completion of reaction, the reaction solution was poured into ice water and extracted with diisopropyl ether. The obtained organic layer was washed with a saturated aqueous sodium hydrogensulfate solution and washed with saturated brine, followed by removal of the solvent, and Intermediate A4-4 (1.85 g, yield: 92%) was obtained by silica gel column chromatography (hexane).

<Step A4-5>

Intermediate A4-4 (1.85 g, 2.65 mmol) obtained in step A4-4, potassium phosphate (1.12 g, 5.3 mmol), copper powder (0.0168 g, 0.265 mmol), and pyrrolidine (0.283 g, 3.98 mmol) were put into a flask and dissolved in deanol (2.65 ml) under a nitrogen atmosphere, followed by stirring at 60° C. a whole day and night. After the completion of reaction, the reaction solution was poured into water (3 ml) and extracted with diisopropyl ether. The solvent of the obtained organic layer was removed, and Intermediate A4-5 (1.01 g, yield: 60%) was obtained by silica gel column chromatography (hexane:triethylamine=100:3).

<Step A4-6>

Intermediate A4-5 (1.01 g, 1.58 mmol) obtained in step A4-5 and 3,4-dihydroxy-3-cyclobutene-1,2-dione (0.0901 g, 0.79 mmol) were put into a flask and dissolved in a mixed solution of normal butanol (8 ml) and toluene (8 ml) under a nitrogen atmosphere, followed by stirring under reflux for 3 hours. After the completion of reaction, the solvent was removed, and NIR Dye (A4) (0.0185 g, yield: 1.7%) was obtained by $NH_2$-silica gel chromatography (hexane:dichloromethane=4:1).

Ex. 5

NIR Dye (A5) was synthesized according to the reaction route shown below.

[Chem. 14]

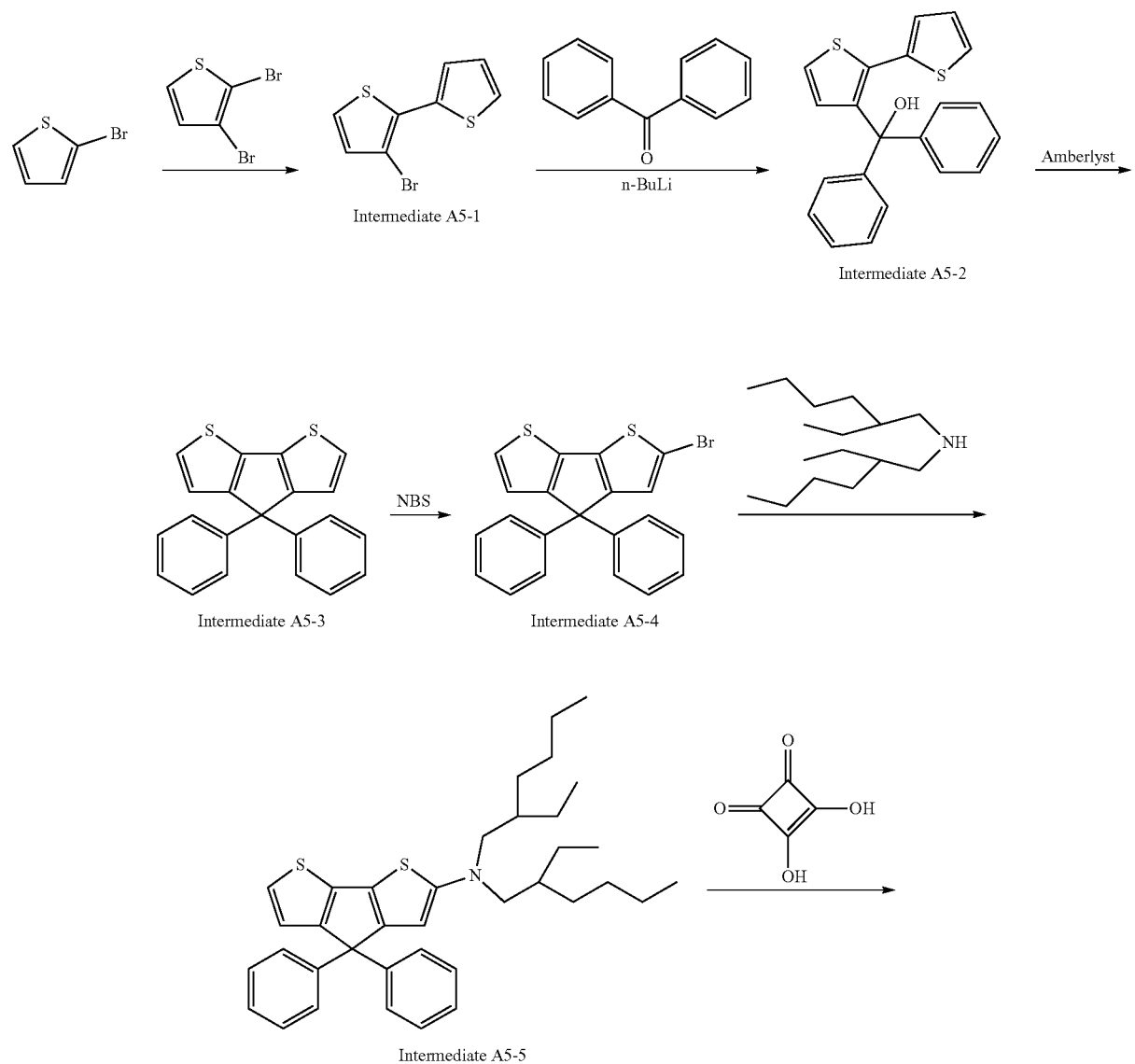

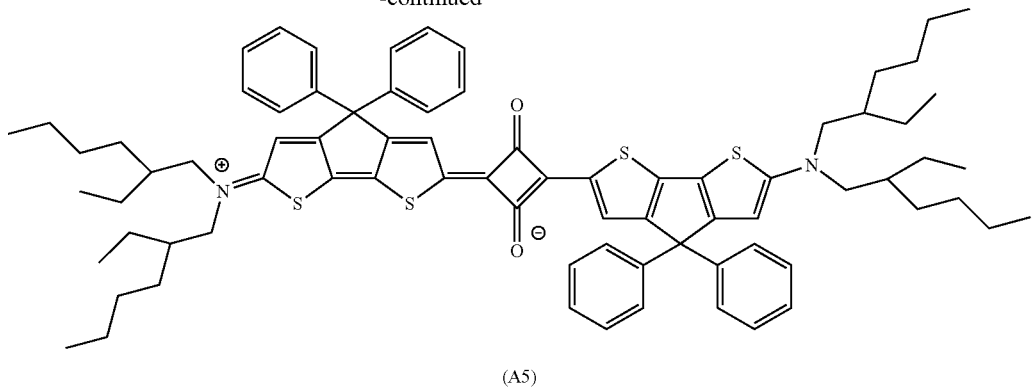

(A5)

<Step A5-1>

2-Bromothiophene (9.00 g, 55.2 mmol) and magnesium (4.03 g, 165 mmol) were put into a flask and dissolved in anhydrous tetrahydrofuran (55 ml) under a nitrogen atmosphere, and the resulting mixed solution was stirred at 80° C. for 1 hour. [1,3-Bis(diphenylphosphino)propane]nickel(II) dichloride (1.20 g, 2.21 mmol) and 2,3-dibromothiophene (12.7 g, 52.5 mmol) were put into another flask and dissolved in anhydrous diethyl ether (110 ml). The resulting diethyl ether mixed solution was cooled to 0° C., and the tetrahydrofuran mixed solution obtained above was added dropwise thereto, followed by stirring at room temperature for 3 hours. After the completion of reaction, water (55 ml) was added to the mixed solution, and the resulting solution was extracted with ethyl acetate. The organic layer was washed with saturated brine, followed by removal of the solvent, and Intermediate A5-1 (8.93 g, yield: 66%) was obtained by silica gel column chromatography (hexane).

<Step A5-2>

Intermediate A5-1 (8.09 g, 33 mmol) obtained in step A5-1 was put into a flask and dissolved in anhydrous diethyl ether (230 ml) under a nitrogen atmosphere. The resulting solution was cooled to −78° C., and a hexane solution (20 ml, 32.0 mmol) of 1.6 M normal butyllithium was added dropwise thereto, followed by stirring for 1 hour. Subsequently, an anhydrous diethyl ether solution (120 ml) in which benzophenone (6.56 g, 36.0 mmol) had been dissolved was added dropwise thereto, and the resulting mixed solution was stirred at room temperature a whole day and night. After the completion of reaction, a saturated aqueous ammonium chloride solution (200 ml) was added, and the mixture was extracted with diisopropyl ether. The obtained organic layer was washed with saturated brine, followed by removal of the solvent, and Intermediate A5-2 (8.81 g, yield: 77%) was obtained by silica gel column chromatography (hexane:dichloromethane=1:1).

<Step A5-3>

Intermediate A5-2 (4.94 g, 14.4 mmol) obtained in step A5-2 and Amberlyst 15 (2.3 g) were put in a flask and dissolved in anhydrous toluene (300 ml) under a nitrogen atmosphere, and the resulting solution was stirred under reflux for 7 hours. After the completion of reaction, the solution was filtered to obtain a filtrate, followed by removal of the solvent, and Intermediate A5-3 (4.29 g, yield: 91%) was obtained by silica gel column chromatography (hexane:dichloromethane=2:1).

<Step A5-4>

Intermediate A5-3 (4.00 g, 12.1 mmol) obtained in step A5-3 was put into a flask and dissolved in anhydrous dimethylformamide (120 ml) under a nitrogen atmosphere. To the resulting solution, an anhydrous dimethylformamide solution (30 ml) in which N-bromosuccinimide (2.16 g, 12.1 mmol) had been dissolved was added dropwise, and the mixture was stirred at room temperature a whole day and night. After the completion of reaction, the reaction solution was poured into ice water and extracted with diisopropyl ether. The obtained organic layer was washed with saturated brine, followed by removal of the solvent, and Intermediate A5-4 (3.67 g, yield: 74%) was obtained by silica gel column chromatography (dichloromethane).

<Step A5-5>

Intermediate A5-4 (3.50 g, 8.55 mmol) obtained in step A5-4 and magnesium turnings (0.416 g, 17.1 mmol) were put into a flask and dissolved in anhydrous tetrahydrofuran (20 ml) under a nitrogen atmosphere. The resulting solution was refluxed for 3 hours and cooled to −40° C. In another flask, N-chlorosuccinimide (1.03 g, 7.70 mmol) was dissolved in anhydrous toluene (20 ml) under a nitrogen atmosphere, and bis-(2-ethylhexyl)amine (1.86 g, 7.70 mmol) was added, followed by stirring for 20 minutes.

Tetraisopropyl orthotitanate (2.43 g, 8.55 mmol) was added dropwise to the mixed solution cooled to −40° C. and after stirring for 5 minutes, the mixed solution of N-chlorosuccinimide and bis-(2-ethylhexyl)amine was added dropwise thereto, followed by stirring at room temperature for 3 hours. After the completion of reaction, a saturated aqueous potassium carbonate solution (17 ml) was added, and subsequently, the mixture was diluted with ethyl acetate and filtered. The resulting solution was extracted with ethyl acetate, and the obtained organic layer was washed with saturated brine. The solvent was removed, and Intermediate A5-5 (1.34 g, yield: 27.5%) was obtained by silica gel column chromatography (hexane:triethylamine=100:3).

<Step A5-6>

Intermediate A5-5 (1.30 g, 2.28 mmol) obtained in step A5-5 and 3,4-dihydroxy-3-cyclobutene-1,2-dione (0.130 g, 1.14 mmol) were put into a flask and dissolved in a mixed solution of normal butanol (6 ml) and toluene (6 ml) under a nitrogen atmosphere, followed by stirring under reflux for 3 hours. After the completion of reaction, the solvent was removed, and NIR Dye (A5) (0.445 g, yield: 32%) was obtained by silica gel chromatography (dichloromethane:methanol:triethylamine=100:1:3).

Ex. 6
NIR Dye (A6) was synthesized according to the reaction route shown below.
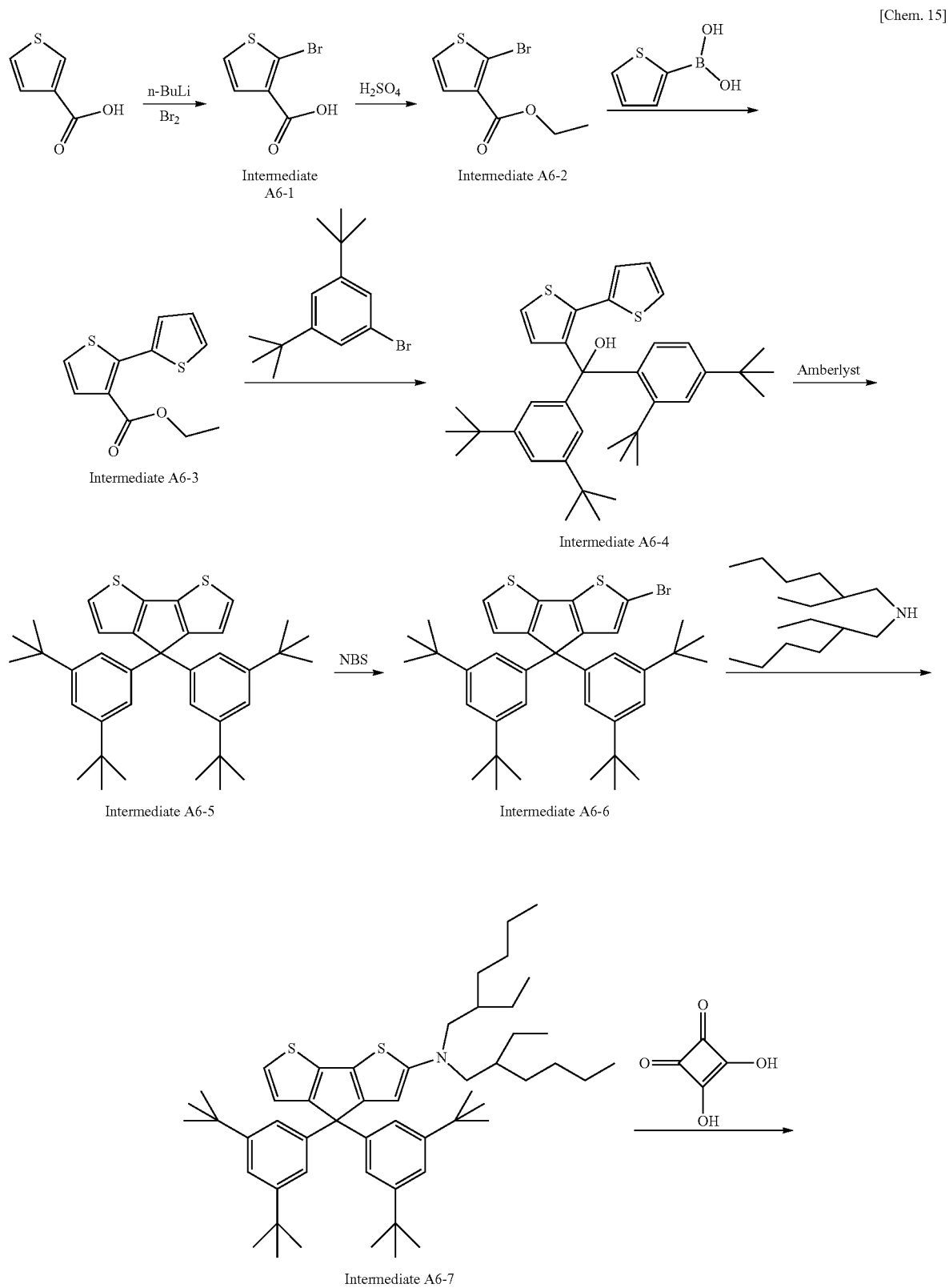

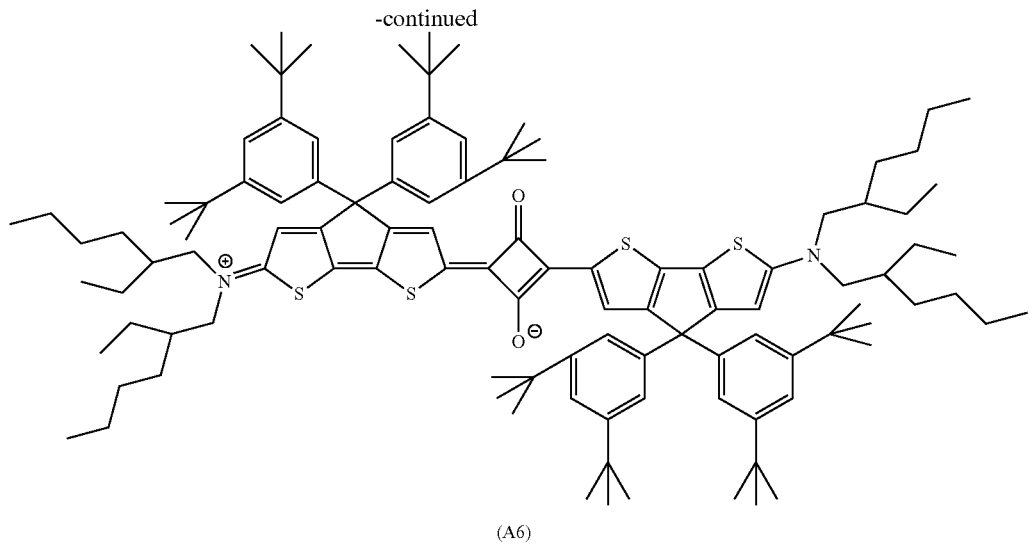

(A6)

<Step A6-1>

3-Thiophenecarboxylic acid (15.0 g, 117 mmol) was put into a flask and dissolved in anhydrous tetrahydrofuran (230 ml) under a nitrogen atmosphere, and the resulting solution was cooled to −78° C. A hexane solution (90 ml, 234 mmol) of 1.6 M normal butyllithium was added dropwise thereto and after stirring for 30 minutes, and then bromine (20.6 g, 129 mmol) was added thereto, followed by stirring at room temperature a whole day and night. After the completion of reaction, an aqueous 1 M hydrochloric acid solution was added, and the mixture was subjected to extraction with ethyl acetate, washing with saturated brine and removal of the solvent to obtain Intermediate A6-1 (13.9 g, yield: 57%).

<Step A6-2>

Intermediate A6-1 (13.9 g, 67.1 mmol) obtained in step A6-1 was put into a flask and dissolved in ethanol (336 ml) under a nitrogen atmosphere. An aqueous 1.28 M sulfuric acid solution (3.36 ml) was added dropwise to the solution above, and the mixture was stirred under reflux for 12 hours. After the completion of reaction, the reaction solution was neutralized with an aqueous 1 M sodium hydroxide solution and extracted with ethyl acetate to obtain an organic layer. The obtained organic layer was washed with saturated brine, and the solvent was removed to obtain Intermediate A6-2 (13.8 g, yield: 87%).

<Step A6-3>

Intermediate A6-2 (10.6 g, 45.0 mmol) obtained in step A6-2, 2-thiopheneboronic acid (17.3 g, 135 mmol), and [1,1'-bis(diphenylphosphino)ferrocene]palladium(II) dichloride dichloromethane adduct (1.87 g, 2.25 mmol) were put into a flask and dissolved in 1,4-dioxane (45 ml) under a nitrogen atmosphere. An aqueous 17 M potassium carbonate solution (5.2 ml) was added dropwise to the mixed solution above, and the mixture was stirred under reflux a whole day and night. After the completion of reaction, the reaction solution was filtered to obtain a filtrate and extracted with ethyl acetate to obtain an organic layer. The obtained organic layer was washed with saturated brine, followed by removal of the solvent, and Intermediate A6-3 (10.5 g, yield: 98%) was obtained by silica gel column chromatography (hexane:ethyl acetate=7:1).

<Step A6-4>

1-Bromo-3,5-ditertiary butylbenzene (24.6 g, 90.4 mmol) and magnesium turnings (3.29 g, 136 mmol) were put into a flask and dissolved in anhydrous tetrahydrofuran (34 ml) under a nitrogen atmosphere. The resulting mixed solution was stirred under reflux for 1 hour. Intermediate A6-3 (5.38 g, 22.6 mmol) was put into another flask and dissolved in anhydrous tetrahydrofuran (34 ml) under a nitrogen atmosphere, and the resulting solution was cooled to −15° C. The solution containing 1-bromo-3,5-ditertiary butylbenzene was added dropwise to the solution in which Intermediate A6-3 had been dissolved, and the mixture was stirred under reflux for 4 hours. After the completion of reaction, a saturated aqueous ammonium chloride solution was added, and the mixture was extracted with ethyl acetate to obtain an organic layer. The obtained organic layer was washed with saturated brine, followed by removal of the solvent, and Intermediate A6-4 (11.3 g, yield: 94%) was obtained by silica gel column chromatography (hexane:dichloromethane=1:1).

<Step A6-5>

Intermediate A6-4 (9.69 g, 17.5 mmol) obtained in step A6-4 and Amberlyst 15 (2.79 g) were put into a flask and dissolved in anhydrous toluene (524 ml) under a nitrogen atmosphere, and the resulting mixed solution was stirred under reflux for 7 hours. After the completion of reaction, the solution was filtered to obtain a filtrate, followed by removal of the solvent, and Intermediate A6-5 (6.62 g, yield: 68%) was obtained by silica gel column chromatography (hexane:dichloromethane=10:1).

<Step A6-6>

Intermediate A6-5 (6.00 g, 10.8 mmol) obtained in step A6-5 was put into a flask and dissolved in anhydrous dimethylformamide (107 ml) under a nitrogen atmosphere. To the resulting solution, an anhydrous dimethylformamide solution (27 ml) in which N-bromosuccinimide (1.92 g, 10.8 mmol) had been dissolved was added dropwise. This mixed solution was stirred at room temperature a whole day and night. After the completion of reaction, the reaction solution was poured into ice water and extracted with diisopropyl ether. The obtained organic layer was washed with saturated brine, followed by removal of the solvent, and Intermediate A6-6 (6.29 g, yield: 92%) was obtained by silica gel column chromatography (hexane:dichloromethane=1:1).

<Step A6-7>

Intermediate A6-6 (6.00 g, 9.47 mmol) obtained in step A6-6 and magnesium turnings (0.460 g, 18.9 mmol) were put into a flask and dissolved in anhydrous tetrahydrofuran (14 ml) under a nitrogen atmosphere. The resulting solution was refluxed for 3 hours and cooled to −40° C. In another flask, N-chlorosuccinimide (1.14 g, 8.53 mmol) was dissolved in anhydrous toluene (21 ml) under a nitrogen atmosphere, and bis-(2-ethylhexyl)amine (2.06 g, 8.53 mmol) was added, followed by stirring for 20 minutes. Tetraisopropyl orthotitanate (2.69 g, 9.47 mmol) was added dropwise to the mixed solution cooled to −40° C. and after stirring for 5 minutes, and then the mixed solution of N-chlorosuccinimide and bis-(2-ethylhexyl)amine was added dropwise thereto, followed by stirring at room temperature for 3 hours. After the completion of reaction, a saturated aqueous potassium carbonate solution (19 ml) was added, and subsequently, the mixture was diluted with ethyl acetate and filtered. The resulting solution was extracted with ethyl acetate, and the obtained organic layer was washed with saturated brine. The solvent was removed, and Intermediate A6-7 (0.303 g, yield: 4.0%) was obtained by silica gel column chromatography (hexane:triethylamine=100:3).

<Step A6-8>

Intermediate A6-7 (0.300 g, 0.378 mmol) obtained in step A6-7 and 3,4-dihydroxy-3-cyclobutene-1,2-dione (0.0215 g, 0.189 mmol) were put into a flask and dissolved in a mixed solution of normal butanol (1 ml) and toluene (1 ml) under a nitrogen atmosphere, followed by stirring under reflux for 3 hours. After the completion of reaction, the solvent was removed, and NIR Dye (A6) (0.161 g, yield: 51%) was obtained by silica gel chromatography (dichloromethane:methanol:triethylamine=100:1:3).

Ex. 7

NIR Dye (A7) was synthesized according to the reaction route shown below.

[Chem. 16]

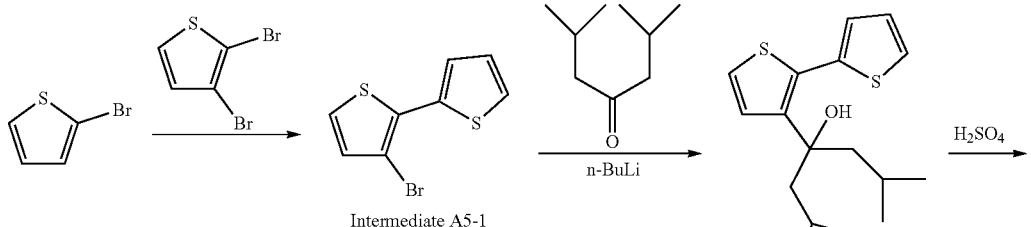

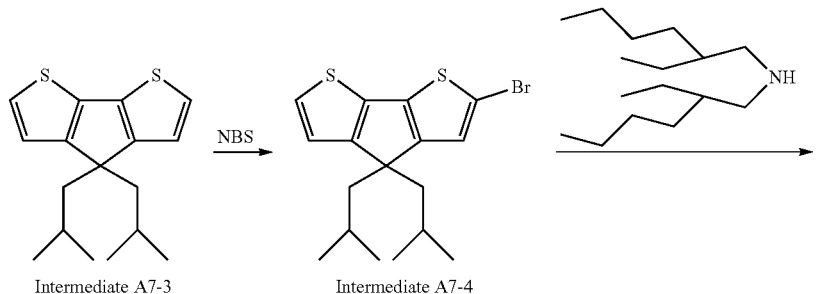

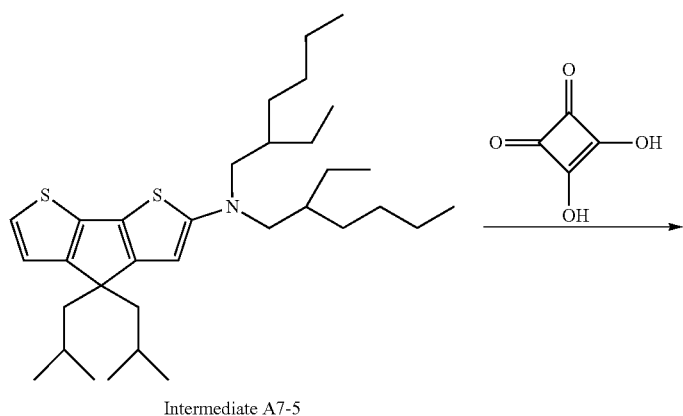

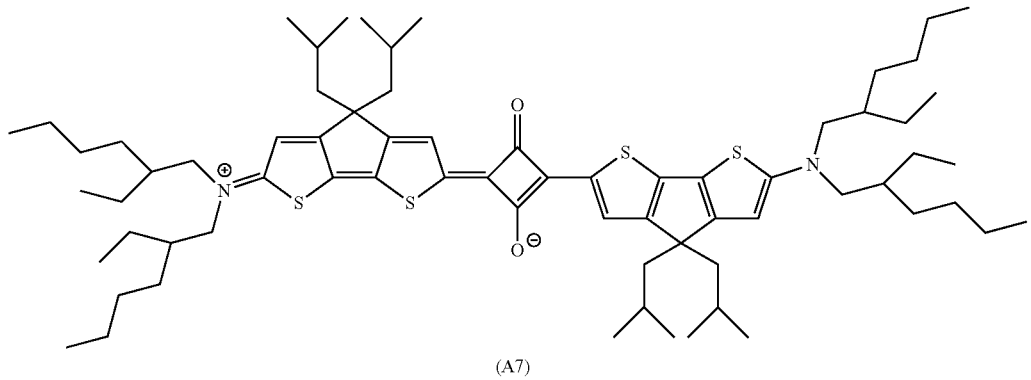

(A7)

<Step A7-1>

Intermediate A5-1 was obtained in the same manner as in step A5-1 of Ex. 5.

<Step A7-2>

Intermediate A5-1 (9.00 g, 36.7 mmol) obtained in step A7-1 was put into a flask and dissolved in anhydrous diethyl ether (250 ml) under a nitrogen atmosphere. The resulting solution was cooled to −78° C., and a hexane solution (21.8 ml, 34.9 mmol) of 1.6 M normal butyllithium was added dropwise thereto, followed by stirring for 1 hour. Subsequently, an anhydrous diethyl ether solution (100 ml) in which 2,6-dimethyl-4-heptanone (5.74 g, 40.4 mmol) had been dissolved was added dropwise thereto, and the resulting mixed solution was stirred at room temperature a whole day and night. After the completion of reaction, a saturated aqueous ammonium chloride solution (220 ml) was added, and the mixture was extracted with ethyl acetate. The obtained organic layer was washed with saturated brine, followed by removal of the solvent, and Intermediate A7-2 (6.83 g, yield: 60%) was obtained by silica gel column chromatography (hexane:ethyl acetate=9:1).

<Step A7-3>

Intermediate A7-2 (6.63 g, 21.5 mmol) obtained in step A7-2 was put into a flask and dissolved in normal octane (200 ml). Concentrated sulfuric acid (14.0 ml) was added dropwise to the solution above, and the mixture was stirred at room temperature a whole day and night. After the completion of reaction, water and dichloromethane were added, and the resulting solution was extracted with dichloromethane. The obtained organic layer was washed with a saturated aqueous sodium hydrogencarbonate solution and then washed with saturated brine, followed by removal of the solvent, and Intermediate A7-3 (3.57 g, yield: 57%) was obtained by silica gel column chromatography (hexane).

<Step A7-4>

Intermediate A7-3 (3.57 g, 12.3 mmol) obtained in step A7-3 was put into a flask and dissolved in anhydrous dimethylformamide (120 ml) under a nitrogen atmosphere. To the resulting solution, an anhydrous dimethylformamide solution (30 ml) in which N-bromosuccinimide (2.19 g, 12.3 mmol) had been dissolved was added dropwise, and the resulting mixed solution was stirred at room temperature a whole day and night. After the completion of reaction, the reaction solution was poured into ice water and extracted with ethyl acetate. The obtained organic layer was washed with saturated brine, followed by removal of the solvent, and Intermediate A7-4 (4.39 g, yield: 97%) was obtained by silica gel column chromatography (hexane).

<Step A7-5>

Intermediate A7-4 (4.31 g, 11.7 mmol) obtained in step A7-4 and magnesium turnings (0.85 g, 35.0 mmol) were put into a flask and dissolved in anhydrous tetrahydrofuran (17 ml) under a nitrogen atmosphere. The resulting solution was refluxed for 3 hours and cooled to −40° C. In another flask, N-chlorosuccinimide (1.40 g, 10.5 mmol) was dissolved in anhydrous toluene (28 ml) under a nitrogen atmosphere, and bis-(2-ethylhexyl)amine (2.53 g, 10.5 mmol) was added thereto, followed by stirring for 20 minutes.

Tetraisopropyl orthotitanate (3.32 g, 11.7 mmol) was added dropwise to the mixed solution cooled to −40° C. and after stirring for 5 minutes, the mixed solution of N-chlorosuccinimide and bis-(2-ethylhexyl)amine was added dropwise thereto, followed by stirring at room temperature for 3 hours. After the completion of reaction, a saturated aqueous potassium carbonate solution (24 ml) was added thereto, and subsequently, the mixture was diluted with ethyl acetate and filtered. The resulting solution was extracted with ethyl acetate, and the obtained organic layer was washed with saturated brine. The solvent was removed, and Intermediate A7-5 (0.76 g, yield: 12%) was obtained by silica gel column chromatography (hexane:triethylamine=100:3).

<Step A7-6>

Intermediate A7-5 (0.76 g, 1.43 mmol) obtained in step A7-5 and 3,4-dihydroxy-3-cyclobutene-1,2-dione (0.082 g, 0.717 mmol) were put into a flask and dissolved in a mixed solution of normal butanol (3.5 ml) and toluene (3.5 ml) under a nitrogen atmosphere, followed by stirring under reflux for 3 hours. After the completion of reaction, the solvent was removed, and NIR Dye (A7) (0.338 g, yield: 41%) was obtained by silica gel chromatography (dichloromethane:methanol:triethylamine=100:1:3).

Ex. 8

NIR Dye (Acf) was synthesized according to the reaction route shown below.

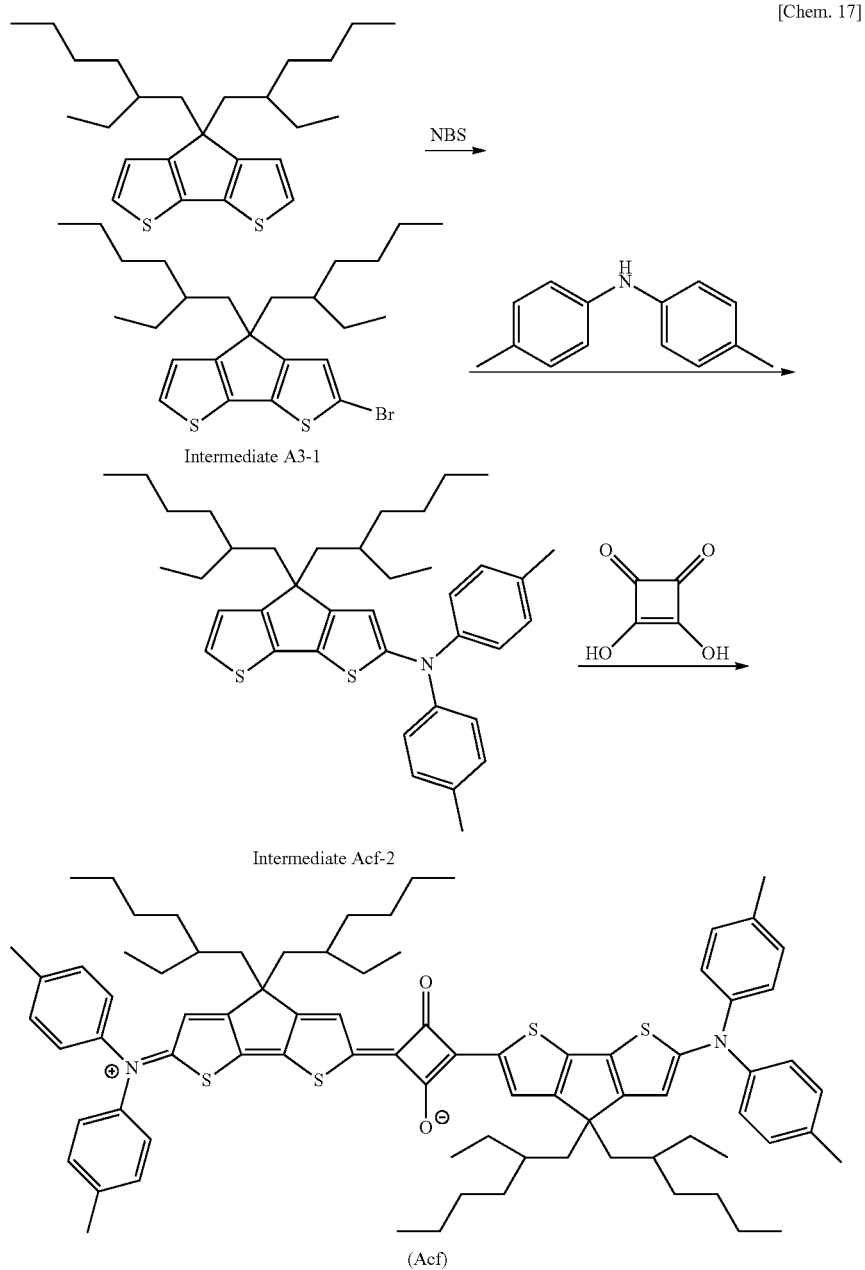

Intermediate A3-1

Intermediate Acf-2

(Acf)

[Chem. 17]

<Step Acf-1>
Intermediate A3-1 was obtained in the same manner as in step A3-1 of Ex. 3.

<Step Acf-2>
Palladium(II) acetate (0.0276 g, 0.123 mmol), sodium tertiary butoxide (0.477 g, 4.96 mmol), and tritertiary butylphosphine (0.0498 g, 0.246 mmol) were put into a flask and dissolved in anhydrous toluene (3 ml) under a nitrogen atmosphere. The resulting mixed solution was stirred at 60° C. for 10 minutes and returned to room temperature, and a mixed solution prepared by dissolving 4,4'-dimethyldiphenylamine (0.539 g, 2.73 mmol) and Intermediate A3-1 (1.19 g, 2.48 mmol) obtained in step Acf-1 in toluene (2 ml) was added dropwise thereto, followed by stirring under reflux for 3 hours. After the completion of reaction, the reaction solution was filtered to obtain a filtrate, followed by removal of the solvent, and Intermediate Acf-2 (0.966 g, 65%) was obtained by silica gel column chromatography (hexane).

<Step Acf-3>
Intermediate Acf-2 (0.966 g, 1.62 mmol) obtained in step Acf-2 and 3,4-dihydroxy-3-cyclobutene-1,2-dione (0.0924 g, 0.810 mmol) were put into a flask and dissolved in a mixed solution of normal butanol (2 ml) and toluene (6 ml) under a nitrogen atmosphere, followed by stirring under reflex for 3 hours. After the completion of reaction, the solvent was removed, and NIR Dye (Acf) (0.0273 g, yield: 2.6%) was obtained by $NH_2$-silica gel chromatography (hexane:dichloromethane=1:1).

Ex. 9
NIR Dye (A21) was obtained through the following schemes and intermediates.
[Chem. 18]
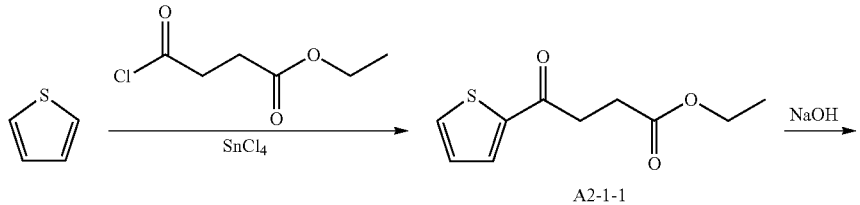
A2-1-1
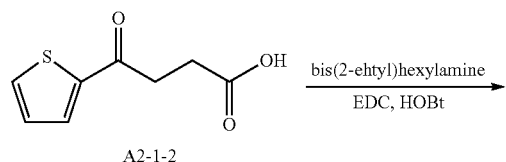
A2-1-2
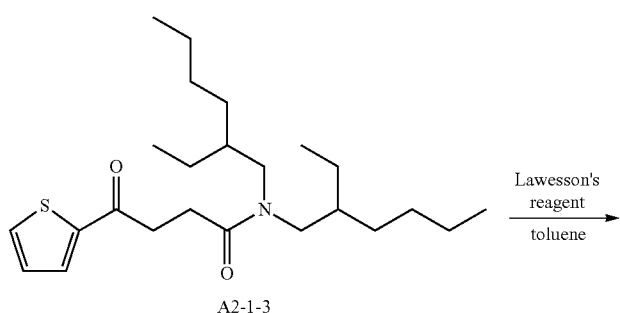
A2-1-3
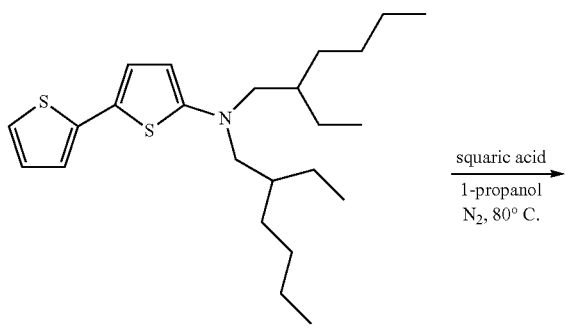
A2-1-4
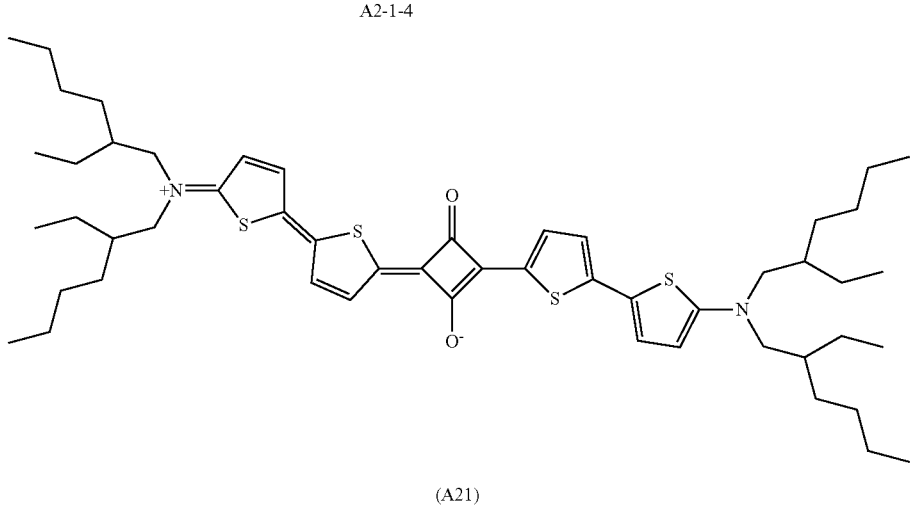
(A21)

[Synthesis of A2-1-1]

To a dichloromethane solution (150 mL) of thiophene (9.20 g, 109 mmol) and ethyl 4-chloro-4-oxobutyrate (18.0 g, 109 mmol), tin(IV) chloride (12.9 mL, 109 mmol) was added dropwise under ice cooling. The reaction solution was stirred at room temperature for 2 hours, then poured into ice water, and extracted with dichloromethane. The organic layer was dried over anhydrous sodium sulfate and then concentrated under reduced pressure to obtain A2-1-1 (21.6 g, 102 mmol, 93% yield).

[Synthesis of A2-1-2]

Sodium hydroxide (6.5 g, 160 mmol) was added to a water/ethanol mixed solution (60 mL/150 mL) of A2-1-1 (21.6 g, 102 mmol), and the resulting solution was heated under reflux with stirring for 2 hours and after cooling to room temperature, neutralized using hydrochloric acid (3 N) under ice cooling. The precipitated solid was collected by filtration and vacuum-dried to obtain A2-1-2 (15.4 g, 83.3 mmol, 82% yield).

[Synthesis of A2-1-3]

To a dichloromethane solution (350 mL) of A2-1-2 (15.4 g, 83.3 mmol) and 1-(3-dimethylaminopropyl)-3-ethylcarbodiimide hydrochloride (19.2 g, 100 mmol), a tetrahydrofuran solution (190 mL) of 1-hydroxybenzotriazole (13.5 g, 100 mmol) was added. Furthermore, a tetrahydrofuran solution (10 mL) of triethylamine (15.1 mL, 108 mmol) and bis(2-ethylhexyl)amine (25.0 mL, 83.3 mmol) was added, and the mixture was stirred at room temperature overnight. The reaction solution was concentrated under reduced pressure and after adding dichloromethane (150 mL), washed with an aqueous sodium hydrogencarbonate solution and water. The organic layer was dried over anhydrous sodium sulfate and then concentrated under reduced pressure to obtain A2-1-3 (34.8 g, 85.4 mmol, 103% yield) as a crude product. The crude product was used for the next reaction without being purified.

[Synthesis of A2-1-4]

A suspension prepared by adding toluene (150 mL) to A2-1-3 (16.2 g, 39.7 mmol) and a Lawesson's reagent (19.3 g, 47.7 mmol) was heated under reflux with stirring for 90 minutes and then allowed to cool to room temperature, and the solvent was distilled off under reduced pressure. Dichloromethane/hexane (10 mL/100 mL) was added to the residue and after removing the deposited precipitate by suction filtration, the resulting solution was concentrated and purified by silica gel column chromatography using a mixed solvent of hexane/ethyl acetate (98:2) as eluent to obtain A2-1-4 (14.6 g, 36.0 mmol, 91% yield).

[Synthesis of NIR Dye (A21)]

A suspension prepared by adding 1-propanol (940 mL) and trimethyl orthoformate (10 mL, 91 mmol) to A2-1-4 (7.00 g, 17.3 mmol) and squaric acid (1.01 g, 8.85 mmol) was heated at 80° C. for 2 hours and 30 minutes with stirring. After allowing to cool to room temperature, the solvent was distilled off under reduced pressure, and dichloromethane (15 mL) was added. The deposited precipitate was collected by filtration and washed with hexane. The filtrate was concentrated, then purified by silica gel column chromatography using hexane/ethyl acetate as eluent, further concentrated, and combined with the filtered-off solid to obtain NIR Dye (A21) (1.44 g, 1.62 mmol, 19% yield).

Ex. 10

NIR Dye (A22) was obtained through the following schemes and intermediates.

[Chem. 19]

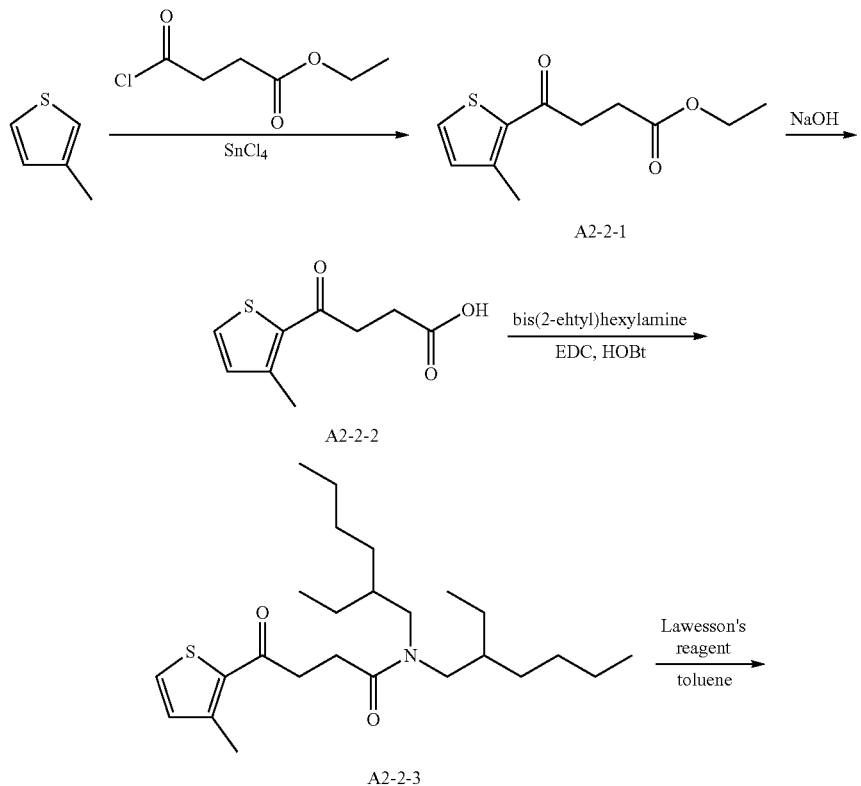

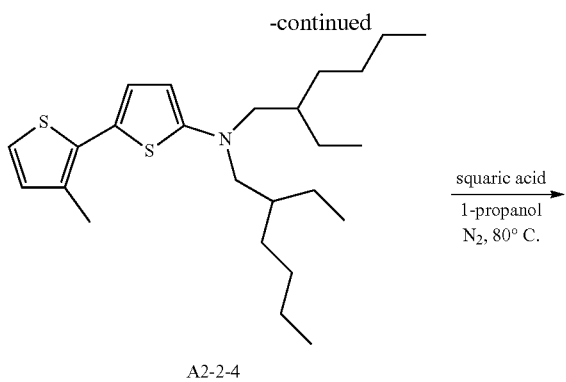

A2-2-4

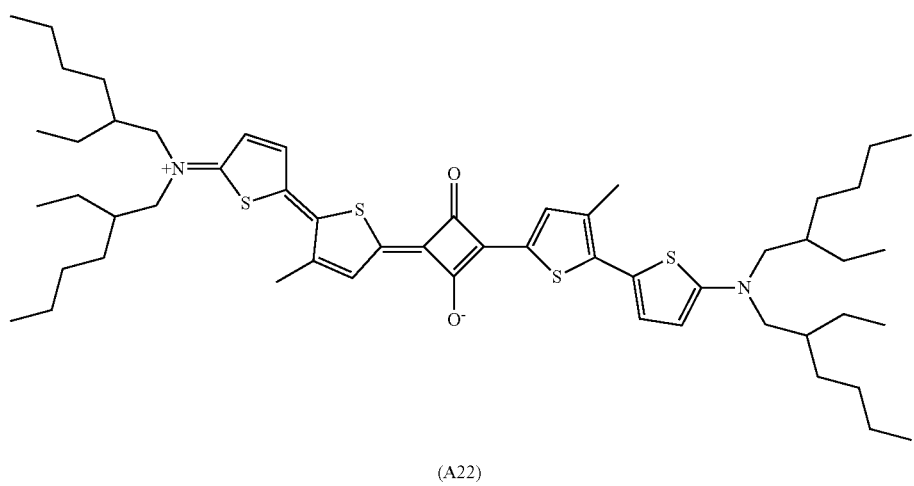

(A22)

[Synthesis of A2-2-1]

To a dichloromethane solution (150 mL) of 3-methylthiophene (5.00 g, 50.9 mmol) and ethyl 4-chloro-4-oxobutyrate (8.38 g, 50.9 mmol), tin(V) chloride (6.0 mL, 51 mmol) was added dropwise under ice cooling. The reaction solution was stirred under ice cooling for 2 hours, then poured into ice water, and extracted with dichloromethane. The organic layer was dried over anhydrous sodium sulfate, then concentrated under reduced pressure, and purified by silica gel column chromatography using hexane/ethyl acetate as eluent to obtain A2-2-1 (8.28 g, 36.6 mmol, 72% yield).

[Synthesis of A2-2-2]

Sodium hydroxide (3.84 g, 96.0 mmol) was added to a water/ethanol mixed solution (60 mL/150 mL) of A2-2-1 (8.28 g, 36.6 mmol), and the resulting solution was heated under reflux with stirring for 2 hours and after cooling to room temperature, neutralized using hydrochloric acid (3N) under ice cooling. The precipitated solid was collected by filtration and dried in vacuum to obtain A2-2-2 (6.79 g, 34.3 mmol, 94% yield).

[Synthesis of A2-2-3]

To a dichloromethane solution (60 mL) of A2-2-2 (2.69 g, 13.6 mmol) and 1-(3-dimethylaminopropyl)-3-ethyl carbodiimide hydrochloride (3.10 g, 16.2 mmol), a tetrahydrofuran solution (50 mL) of 1-hydroxybenzotriazole monohydrate (2.48 g, 16.2 mmol) was added. Furthermore, a tetrahydrofuran solution (10 mL) of triethylamine (2.44 mL, 17.5 mmol) and bis(2-ethylhexyl)amine (4.04 mL, 13.5 mmol) was added, and the mixture was stirred at room temperature overnight. The reaction solution was concentrated under reduced pressure and after adding dichloromethane (50 mL), washed with an aqueous sodium hydrogencarbonate solution and water. The organic layer was dried over anhydrous sodium sulfate and then concentrated under reduced pressure to obtain A2-2-3 (5.88 g, 13.9 mmol, 103% yield) as a crude product. The crude product was used for the next reaction without being purified.

[Synthesis of A2-2-4]

A suspension prepared by adding toluene (100 mL) to A2-2-3 (5.88 g, 13.9 mmol) and a Lawesson's reagent (6.77 g, 16.7 mmol) was heated under reflux with stirring for 2 hours and then allowed to cool to room temperature, and the solvent was distilled off under reduced pressure. The residue was purified by silica gel column chromatography using a mixed solvent of hexane/ethyl acetate (98:2) as eluent to obtain A2-2-4 (2.85 g, 6.79 mmol, 49% yield).

[Synthesis of NIR Dye (A22)]

A suspension prepared by adding 1-propanol (772 mL) and trimethyl orthoformate (9.0 mL, 82 mmol) to A2-2-4 (6.00 g, 14.3 mmol) and squaric acid (907 mg, 7.86 mmol) was heated at 80° C. for 2 hours and 30 minutes with stirring. After allowing to cool to room temperature, the solvent was distilled off under reduced pressure, and the residue was purified twice by silica gel column chromatography using dichloromethane/ethyl acetate and hexane/ethyl acetate, respectively, as eluent to obtain NIR Dye (A22) (549 mg, 598 μmol, 8.4% yield).

Ex. 11
NIR Dye (A23) was obtained through the following schemes and intermediates.
[Chem. 20]
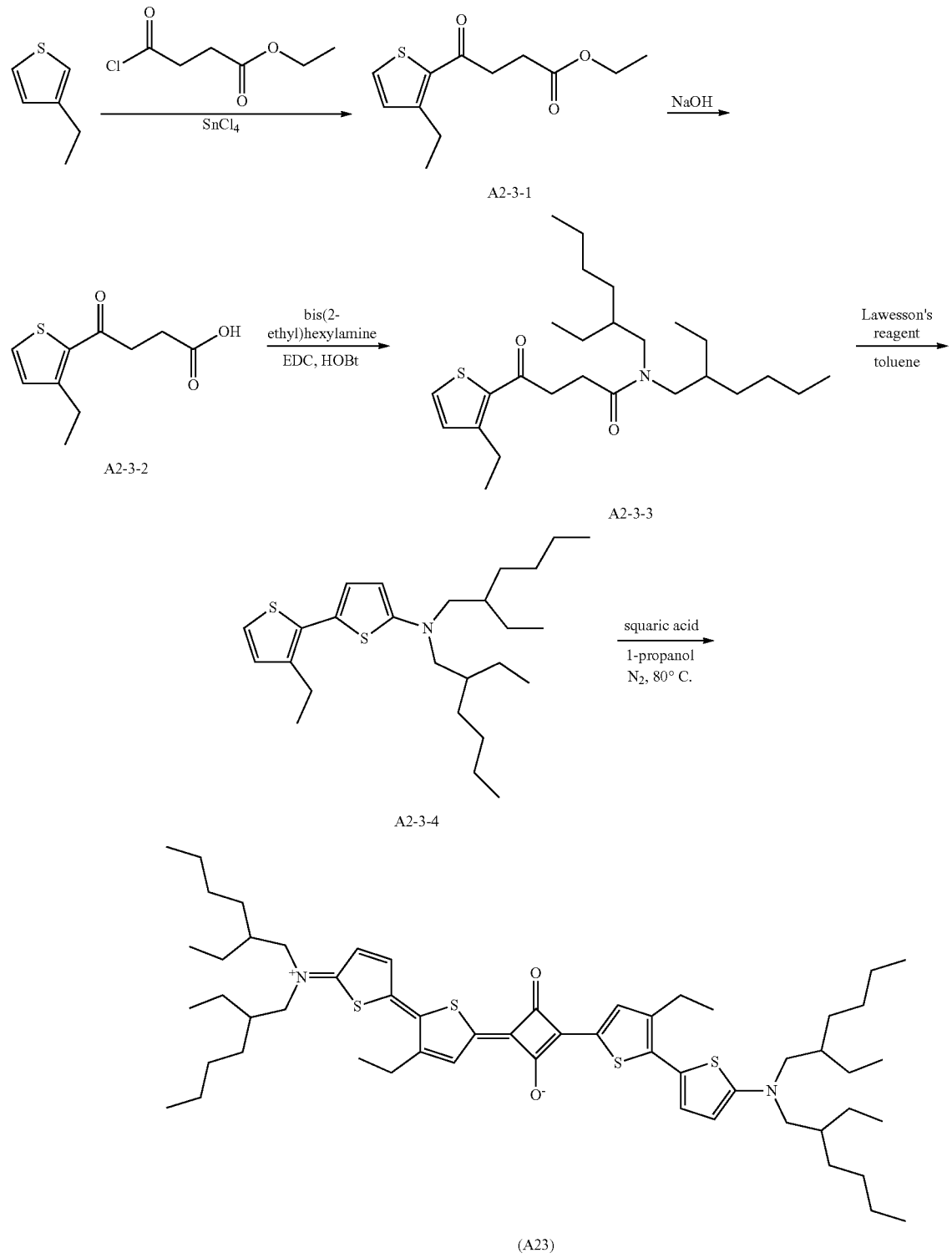

[Synthesis of A2-3-1]

To a dichloromethane solution (150 mL) of 3-ethylthiophene (5.03 g, 44.8 mmol) and ethyl 4-chloro-4-oxobutyrate (7.37 g, 44.8 mmol), tin(V) chloride (5.4 mL, 46 mmol) was added dropwise under ice cooling. The reaction solution was stirred at room temperature for 2 hours, then poured into ice water, and extracted with dichloromethane. The organic layer was dried over anhydrous sodium sulfate, then concentrated under reduced pressure, and purified by silica gel column chromatography using hexane/ethyl acetate as eluent to obtain A2-3-8 (g, 26.1 mmol, 991 yield).

[Synthesis of A2-3-2]

Sodium hydroxide (7.4 g, 190 mmol) was added to water/ethanol mixed solution (50 mL/150 mL) of a 2-3-1 (17.4 g, 72.3 mmol), and the resulting solution was a heated under reflux with stirring for hours and after cooling to room temperature, neutralized using hydrochloric acid (3N) under ice cooling. The precipitated solid was collected by filtration and vacuum-dried to obtain A2-3-2 (14.0 g, 66.1 mmol, 91% yield).

[Synthesis of A2-3-3]

To a dichloromethane solution (200 mL) of A2-3-2 (8.00 g, 37.7 mmol) and 1-(3-dimethyl aminopropyl)-3-ethyl carbodiimide hydrochloride (8.72 g, 45.5 mmol), a tetrahydrofuran solution (130 mL) of 1-hydroxybenzotriazole monohydrate (6.94 g, 45.3 mmol) was added. Furthermore, a tetrahydrofuran solution (10 mL) of triethylamine (7.0 mL, 50 mmol) and bis(2-ethylhexyl)amine (11.5 mL, 38.3 mmol) was added, and the mixture was stirred at room temperature overnight. The reaction solution was concentrated under reduced pressure and after adding dichloromethane (100 mL), washed with an aqueous sodium hydrogencarbonate solution and water. The organic layer was dried over anhydrous sodium sulfate and then concentrated under reduced pressure to obtain A2-3-3 (17.33 g, 39.8 mmol, 106% yield) as a crude product. The crude product was used for the next reaction without being purified.

[Synthesis of A2-3-4]

A suspension prepared by adding toluene (250 mL) to A2-3-3 (17.33 g, 39.8 mmol) and a Lawesson's reagent (19.3 g, 47.73 mmol) was heated under reflux with stirring for 2 hours and then allowed to cool to room temperature, and the solvent was distilled off under reduced pressure. The residue was purified by silica gel column chromatography using a mixed solvent of hexane/ethyl acetate (98:2) as eluent to obtain A2-3-4 (12.8 g, 29.5 mmol, 74% yield).

[Synthesis of NIR Dye (A23)]

A suspension prepared by adding 1-propanol (1.6 L) and trimethyl orthoformate (16 mL, 150 mmol) to A2-3-4 (12.8 g, 29.5 mmol) and squaric acid (1.87 g, 16.4 mmol) was heated at 80° C. for 2 hours and 30 minutes with stirring. After allowing to cool to room temperature, the solvent was distilled off under reduced pressure, and the residue was purified twice by silica gel column chromatography using dichloromethane/ethyl acetate and hexane/ethyl acetate, respectively, as eluent to obtain NIR Dye (A23) (830 mg, 878 μmol, 6.0% yield).

Ex. 12

NIR Dye (A24) was obtained through the following schemes and intermediates.

[Chem. 21]

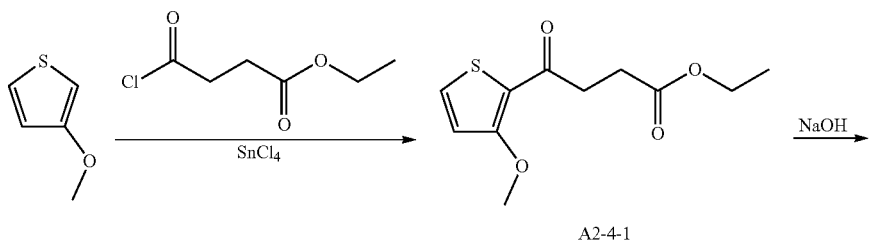

A2-4-1

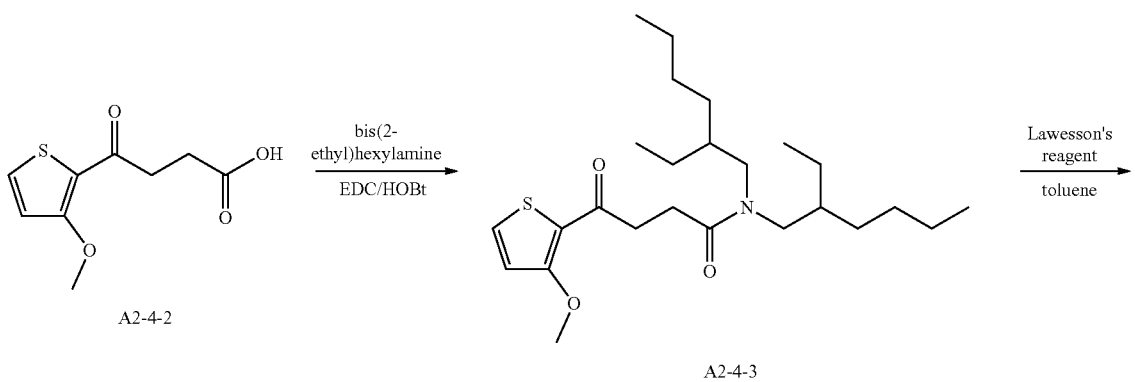

A2-4-2

A2-4-3

-continued

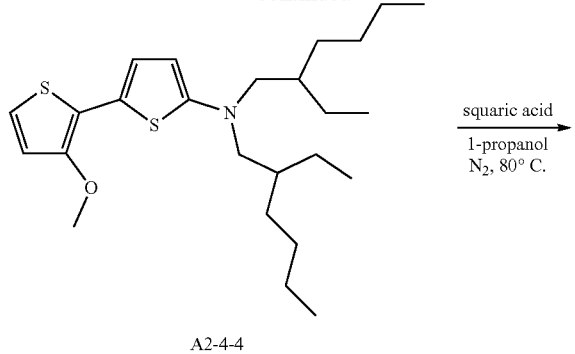

A2-4-4 squaric acid
1-propanol
N₂, 80° C.
→

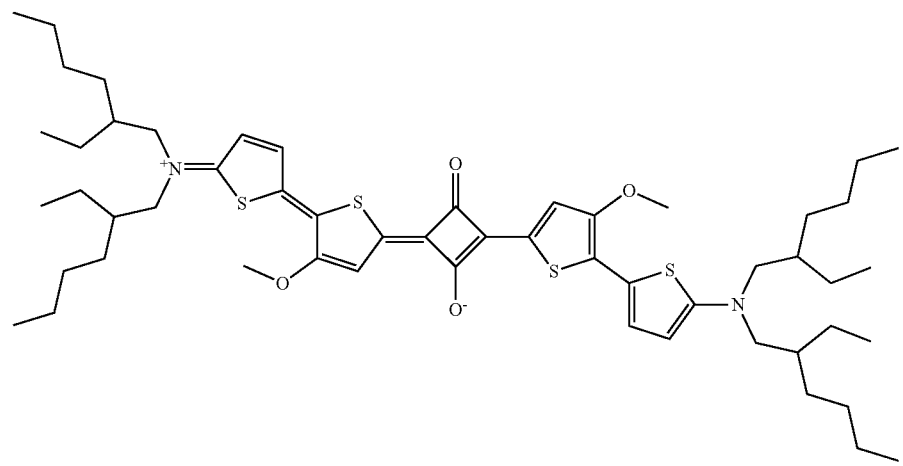

(A24)

[Synthesis of A24-1]

To a dichloromethane solution (300 mL) of 3-methoxythiophene (25.1 g, 220 mmol) and ethyl 4-chloro-4-oxobutyrate (31.0 mL, 220 mmol), tin(IV) chloride (26.0 mL, 221 mmol) was added dropwise. The reaction solution was stirred at room temperature for 2 hours, then poured into ice water, and extracted with dichloromethane. The organic layer was dried over anhydrous sodium sulfate and then concentrated under reduced pressure to obtain A2-4-1 (43.9 g, 181 mmol, 83% yield).

[Synthesis of A2-4-2]

Sodium hydroxide (4.40 g, 110 mmol) was added to a water/ethanol mixed solution (50 mL/150 mL) of A2-4-1 (10.9 g, 45.0 mmol), and the resulting solution was heated under reflux with stirring for 2 hours and after cooling to room temperature, neutralized using hydrochloric acid (3 N) under ice cooling. The precipitated solid was collected by filtration and dried in vacuum to obtain A2-4-2 (8.96 g, 41.8 mmol, 93% yield).

[Synthesis of A2-4-3]

To a dichloromethane solution (200 mL) of A2-4-2 (8.96 g, 41.8 mmol) and 1-(3-dimethylaminopropyl)-3-ethyl carbodiimide hydrochloride (9.8 g, 51 mmol), a tetrahydrofuran solution (190 mL) of 1-hydroxybenzotriazole monohydrate (7.8 g, 51 mmol) was added. Furthermore, a tetrahydrofuran solution (10 mL) of triethylamine (7.6 mL, 55 mmol) and bis(2-ethylhexyl)amine (12.6 mL, 42.0 mmol) was added, and the mixture was stirred at room temperature overnight. The reaction solution was concentrated under reduced pressure and after adding dichloromethane (150 mL washed with an aqueous sodium hydrogencarbonate solution and water. The organic layer was dried over anhydrous sodium sulfate and then concentrated under reduced pressure to obtain A2-4-3 (18.9 g, 43.3 mmol, 103% yield) as a crude product. The crude product was used for the next reaction without being purified.

[Synthesis of A2-4-4]

A suspension prepared by adding toluene (200 mL) to A2-4-3 (18.9 g, 43.3 mmol) and a Lawesson's reagent (21.8 g, 53.9 mmol) was heated under reflux with stirring for 2 hours and then allowed to cool to room temperature, and the solvent was distilled off under reduced pressure. The residue was purified by silica gel column chromatography using a mixed solvent of hexane/ethyl acetate (98:2) as eluent to obtain A2-4-4 (12.1 g, 27.7 mmol, 64% yield).

[Synthesis of NIR Dye (A24)]

A suspension prepared by adding 1-propanol (10 mL) and trimethyl orthoformate (100 μL, 0.9 mmol) to A2-4-4 (81.7 mg, 18.8 μmol) and squaric acid (11.8 mg, 10.3 μmol) was heated at 80° C. for 1 hour and 30 minutes with stirring. After allowing to cool to room temperature, the solvent was distilled off under reduced pressure, and the residue was purified twice by silica gel column chromatography using dichloromethane/ethyl acetate and hexane/ethyl acetate, respectively, as eluent to obtain NIR Dye (A24) (6.4 mg, 6.7 μmol, 7.2% yield).

Ex. 13

NIR Dye (A25) was obtained through the following schemes and intermediates.

[Chem. 22]

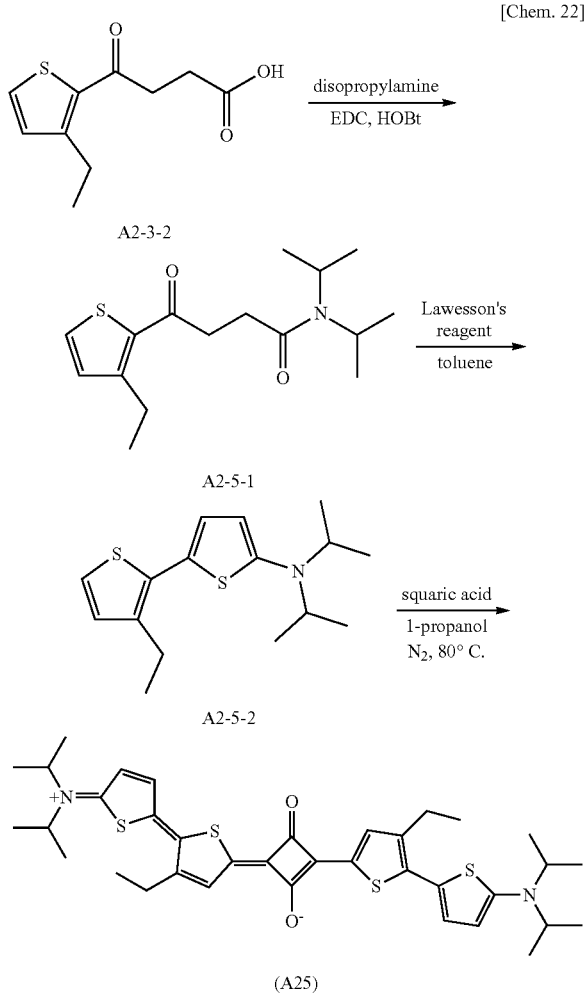

[Synthesis of A2-5-1]

To a dichloromethane solution (100 mL) of A2-3-2 (5.0 g, 23 mmol) and 1-(3-dimethylaminopropyl)-3-ethylcarbodiimide hydrochloride (5.37 g, 28.0 mmol), a tetrahydrofuran solution (40 mL) of 1-hydroxybenzotriazole monohydrate (4.4 g, 29 mmol) was added. Furthermore, a tetrahydrofuran solution (10 mL) of triethylamine (4.5 mL, 32 mmol) and diisopropylamine (4.1 mL, 29 mmol) was added thereto, and the mixture was stirred at room temperature overnight. The reaction solution was concentrated under reduced pressure and after adding dichloromethane (50 mL), washed with an aqueous sodium hydrogencarbonate solution and water. The organic layer was dried over anhydrous sodium sulfate, then concentrated under reduced pressure, and purified by silica gel column chromatography using hexane/ethyl acetate as eluent to obtain A2-5-1 (1.52 g, 5.11 mmol, 22% yield).

[Synthesis of A2-5-2]

A suspension prepared by adding toluene (100 mL) to A2-5-1 (1.79 g, 6.06 mmol) and a Lawesson's reagent (2.98 g, 7.37 mmol) was heated under reflux with stirring for 2 hours and then allowed to cool to room temperature, and the solvent was distilled off under reduced pressure. The residue was purified by silica gel column chromatography using a mixed solvent of hexane/ethyl acetate as eluent to obtain A2-5-2 (751 mg, 2.56 mmol, 42% yield).

[Synthesis of NIR Dye (A25)]

A suspension prepared by adding 1-propanol (150 mL) and trimethyl orthoformate (60 µL, 0.5 mmol) to A2-5-2 (1.5 g, 5.1 mmol) and squaric acid (320 mg, 2.8 mmol) was heated at 80° C. for 1 hour with stirring. After allowing to cool to room temperature, the solvent was distilled off under reduced pressure, and the residue was purified by silica gel column chromatography using dichloromethane/ethyl acetate as eluent. The obtained solid was washed with hexane to obtain NIR Dye (A25) (98 mg, 147 µmol, 5.8% yield).

Ex. 14

NIR Dye (A26) was obtained through the following schemes and intermediates.

[Chem. 23]

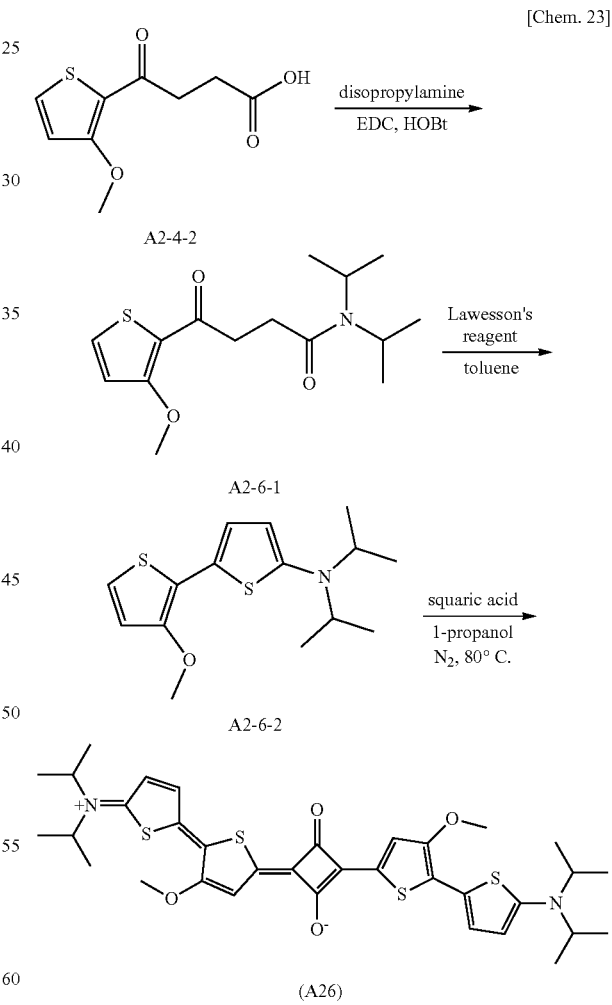

[Synthesis of A2-6-1]

To a dichloromethane solution (200 mL) of A2-4-2 (10.0 g, 46.7 mmol) and 1-(3-dimethylaminopropyl)-3-ethylcarbodiimide hydrochloride (11.0 g, 57.3 mmol), a tetrahydrofuran solution (90 mL) of 1-hydroxybenzotriazole monohydrate (8.61 g, 56.2 mmol) was added. Furthermore, a tetrahydrofuran solution (10 mL) of triethylamine (9.0 mL, 65 mmol) and diisopropylamine (8.0 mL, 57 mmol) was added thereto, and the mixture was stirred at room temperature overnight. The reaction solution was concentrated under reduced pressure and after adding dichloromethane (100 mL), washed with an aqueous sodium hydrogencarbonate solution and water. The organic layer was dried over anhydrous sodium sulfate, then concentrated under reduced pressure, and purified by silica gel column chromatography using hexane/ethyl acetate as eluent to obtain A2-6-1 (3.33 g, 11.2 mmol, 24% yield).

[Synthesis of A2-6-2]

A suspension prepared by adding toluene (100 mL) to A2-6-1 (3.33 g, 11.2 mmol) and a Lawesson's reagent (5.78 g, 14.3 mmol) was heated under reflux with stirring for 1 hour and 30 minutes and then allowed to cool to room temperature, and the solvent was distilled off under reduced pressure. The residue was purified by silica gel column chromatography using a mixed solvent of hexane/ethyl acetate as eluent to obtain A2-6-2 (630 mg, 2.1 mmol, 19% yield).

[Synthesis of NIR Dye (A26)]

A suspension prepared by adding 1-propanol (100 mL) and trimethyl orthoformate (1.5 mL, 14 mmol) to A2-6-2 (800 mg, 2.71 mmol) and squaric acid (178 mg, 1.56 mmol) was heated at 80° C. for 3 hours with stirring. After allowing to cool to room temperature, the solvent was distilled off under reduced pressure, and the residue was purified twice by silica gel column chromatography using dichloromethane/ethyl acetate and hexane/ethyl acetate, respectively, as eluent to obtain NIR Dye (A26) (140 mg, 209 µmol, 15% yield).

Ex. 15

NIR Dye (A27) was obtained through the following schemes and intermediates.

[Chem. 24]

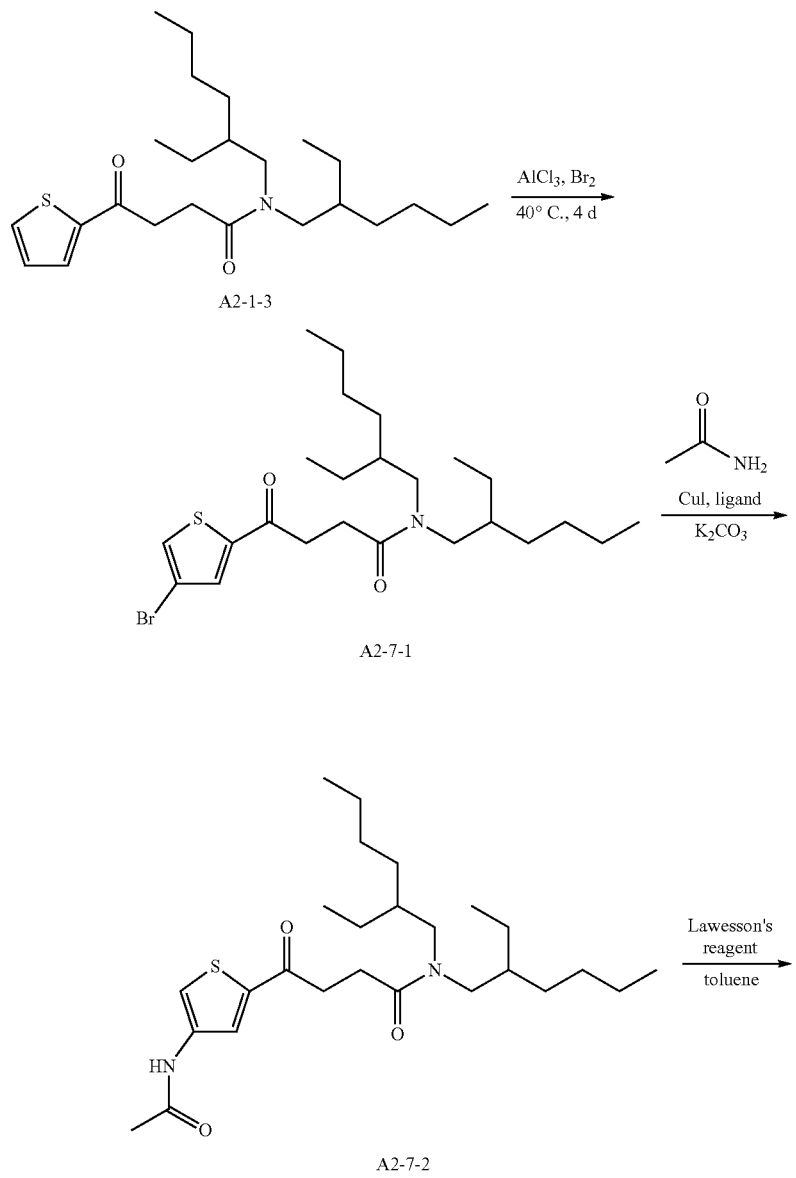

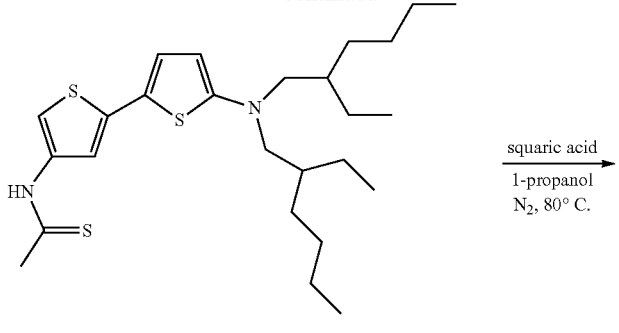

A2-7-3

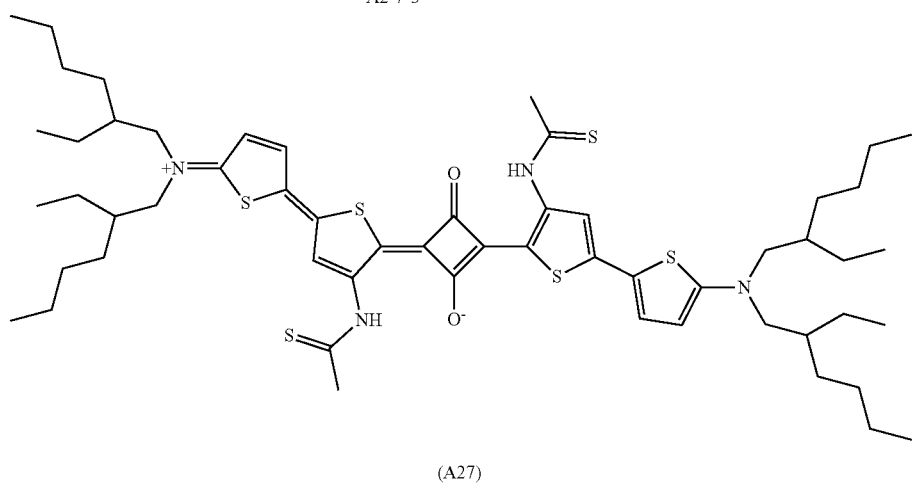

(A27)

[Synthesis of A2-7-1]

After bromine (1.30 mL, 25.3 mmol) was added dropwise to a chloroform suspension (150 mL) of A2-1-3 (10.1 g, 24.8 mmol) and aluminum(III) chloride (9.81 g, 73.6 mmol), the reaction solution was stirred at 40° C. for 4 days, and the reaction was stopped using 3M hydrochloric acid under ice cooling. The reaction solution was washed with an aqueous sodium thiosulfate solution and extracted with dichloromethane. The organic layer was dried over anhydrous sodium sulfate, then concentrated under reduced pressure, and purified by silica gel column chromatography using hexane/ethyl acetate as eluent to obtain A2-7-1 (4.55 g, 9.35 mmol, 38% yield).

[Synthesis of A2-7-2]

After a Schlenk flask containing copper(I) iodide (25.2 mg, 132 µmol), acetamide (77 mg, 1.30 mmol) and potassium carbonate (295 mg, 2.13 mmol) was purged with nitrogen, a 1,4-dioxane solution (1.0 mL) of A2-7-1 (505 mg, 1.04 mmol) and trans-12-diaminocyclohexane (racemic form) (15 µL, 120 µmol) was added. The resulting suspension was heated under reflux for one day under nitrogen, then cooled to room temperature, and filtered by means of celite while washing the solid with dichloromethane. The filtrate was concentrated under reduced pressure and purified by silica gel column chromatography using hexane/ethyl acetate as eluent to obtain A2-7-1 (200 mg, 43.0 µmol, 41% yield).

[Synthesis of A2-7-3]

A suspension prepared by adding toluene (70 mL) to A2-7-2 (1.38 g, 2.97 mmol) and a Lawesson's reagent (2.40 g, 6.08 mmol) was heated under reflux with stirring for 2 hours and then allowed to cool to room temperature, and the solvent was distilled off under reduced pressure. The residue was purified by silica gel column chromatography using a mixed solvent of hexane/ethyl acetate as eluent to obtain A2-7-3 (269 mg, 562 µmol, 19% yield).

[Synthesis of NIR Dye (A27)]

A suspension prepared by adding 1-propanol (12 mL) and trimethyl orthoformate (0.15 mL, 1.4 mmol) to A2-7-3 (99.8 mg, 208 µmol) and squaric acid (15.3 mg, 134 µmol) was heated at 80° C. for 25 minutes with stirring. After allowing to cool to room temperature, the solvent was distilled off under reduced pressure, and the residue was dissolved in dichloromethane and then reprecipitated by means of hexane. The obtained solid was purified by silica gel column chromatography using hexane/ethyl acetate as eluent to obtain NIR Dye (A27) (16.8 mg, 16.2 µmol, 16% yield).

[Evaluation]

(Measurement of Transmittance in Dichloromethane)

Each of NIR Dyes (A1) to (A7) and NIR Dye (Acf) obtained above was dissolved in dichloromethane and measured for the absorption spectrum of light with a wavelength within the range of 400 nm to 1,200 nm, and the maximum absorption wavelength $\lambda_{max(A)DCM}$ was determined from the absorbance curve. Furthermore, from an absorbance curve when the dye concentration in dichloromethane was adjusted such that the transmittance of light at the maximum absorption wavelength $\lambda_{max(A)DCM}$ is 10%, the average transmittance $T_{400-500(A)DCM}$ at a wavelength within the range of 400 nm to 500 nm, the average transmittance $T_{500-600(A)DCM}$ at a wavelength within the range of 500 nm to 600 nm, and the average transmittance $T_{600-700(A)DCM}$ at a wavelength within the range of 600 nm to 700 nm were determined. The results are shown in Table 3.

TABLE 3

| | Abbreviated Symbol of Dye | $\lambda_{max(A)DCM}$ [nm] | $T_{400-500(A)DCM}$ [%] | $T_{500-600(A)DCM}$ [%] | $T_{600-700(A)DCM}$ [%] |
|---|---|---|---|---|---|
| Ex. 1 | A1 | 906 | 96.7 | 95.6 | 97.6 |
| Ex. 2 | A2 | 909 | 97.4 | 95.0 | 98.1 |
| Ex. 3 | A3 | 918 | 97.3 | 95.4 | 97.9 |
| Ex. 4 | A4 | 887 | 94.1 | 95.4 | 95.0 |
| Ex. 5 | A5 | 930 | 99.3 | 96.9 | 99.0 |
| Ex. 6 | A6 | 926 | 98.2 | 96.4 | 98.2 |
| Ex. 7 | A7 | 921 | 98.6 | 97.2 | 98.5 |
| Ex. 8 | Acf | 888 | 82.8 | 82.3 | 88.7 |

As apparent from the results in Table 3, NIR Dyes (A1) to (A7) of Examples 1 to 7 show a high transmittance of 90% or more in all of the average transmittance $T_{400-500(A)DCM}$ at a wavelength within the range of 400 nm to 500 nm, the average transmittance $T_{500-600(A)DCM}$ at a wavelength within the range of 500 nm to 600 nm, and the average transmittance $T_{600-700(A)DCM}$ at a wavelength within the range of 600 nm to 700 nm. On the other hand, NIR Dye (Acf) of Ex. 8 as Comparative Example shows a low transmittance of 80% level in all of the transmittances. These results demonstrate that NIR Dyes (A1) to (A7) of Examples 1 to 7 are an excellent near-infrared absorbing dye exhibiting a high transmittance in the visible light region and having light absorption in the near-infrared region.

Similarly, each of NIR Dyes (A21) to (A27) obtained above was dissolved in dichloromethane and measured for the absorption spectrum of light with a wavelength within the range of 400 nm to 1,200 nm, and the maximum absorption wavelength $\lambda_{max(A)DCM}$ was determined from the absorbance curve. Furthermore, from an absorbance curve when the dye concentration in dichloromethane was adjusted such that the transmittance of light at the maximum absorption wavelength $\lambda_{max(A)}$ DCM becomes 10%, the average transmittance $T_{400-500(A)DCM}$ at a wavelength within the range of 400 nm to 500 nm, the average transmittance $T_{500-600(A)DCM}$ at a wavelength within the range of 500 nm to 600 nm, and the average transmittance $T_{600-700(A)DCM}$ at a wavelength within the range of 600 nm to 700 nm were determined. The results are shown in Table 4.

to 500 nm, the average transmittance $T_{500-600(A)DCM}$ at a wavelength within the range of 500 nm to 600 nm, and the average transmittance $T_{600-700(A)DCM}$ at a wavelength within the range of 600 nm to 700 nm. These results demonstrate that NIR Dyes (A21) to (A27) of Examples 9 to 15 are an excellent near-infrared absorbing dye exhibiting a high transmittance in the visible light region and having light absorption in the near-infrared region.

(Measurement of Transmittance of Absorption Layer Formed)

Using NIR Dye (A5) as a representative example exhibiting the highest visible light transmittance out of NIR dyes obtained above and NIR Dye (Acf) of Comparative Example, an absorption layer was prepared by mixing each dye with a transparent resin and evaluated for optical characteristics.

The NIR dye, a transparent resin (Neopulim (registered trademark) C3G30, produced by MITSUBISHI GAS CHEMICAL COMPANY, INC., trade name, polyimide resin), and cyclohexanone were thoroughly stirred and uniformly dissolved. The obtained solution was applied onto a glass plate (D263; manufactured by SCHOTT AG, trade name) and dried to obtain an absorption layer having a film thickness of 1 µm. The amount of the dye added (dye concentration) was adjusted such that with a film thickness of 1 µm, the transmittance of light at the maximum absorption wavelength $\lambda_{max(A)TR}$ is 0%. An absorbance curve of the absorption layer was obtained using an absorbance curve of the glass plate with an absorption layer and an absorbance curve of the glass plate, each in the wavelength range of 350 nm to 1,200 nm. From the absorbance curve of the absorption layer, the maximum absorption wavelength $\lambda_{max(A)TR}$, the average transmittance $T_{400-500(A)TR}$ at a wavelength within the range of 400 nm to 500 nm, the average trans-

TABLE 4

| | Abbreviated Symbol of Dye | $\lambda_{max(A)DCM}$ [nm] | $T_{400-500(A)DMC}$ [%] | $T_{500-600(A)DMC}$ [%] | $T_{600-700(A)DMC}$ [%] |
|---|---|---|---|---|---|
| Ex. 9 | A21 | 923 | 97.4 | 95.2 | 97.6 |
| Ex. 10 | A22 | 931 | 96.8 | 94.2 | 96.4 |
| Ex. 11 | A23 | 931 | 96.3 | 94.1 | 95.9 |
| Ex. 12 | A24 | 1005 | 94.8 | 91.7 | 90.7 |
| Ex. 13 | A25 | 923 | 95.3 | 93.3 | 95.7 |
| Ex. 14 | A26 | 998 | 95.5 | 93.2 | 93.7 |
| Ex. 15 | A27 | 995 | 91.5 | 93.4 | 96.5 |

As apparent from the results in Table 4, NIR Dyes (A21) to (A27) of Examples 9 to 15 show a high transmittance of 90% or more in all of the average transmittance $T_{400-500(A)DCM}$ at a wavelength within the range of 400 nm mittance $T_{500-600(A)TR}$ at a wavelength within the range of 500 nm to 600 nm, and the average transmittance $T_{600-700(A)TR}$ at a wavelength within the range of 600 nm to 700 nm were determined. The results are shown in Table 5.

TABLE 5

| | Abbreviated Symbol of Dye | $\lambda_{max(A)TR}$ [nm] | $T_{400\text{-}500(A)TR}$ [%] | $T_{500\text{-}600(A)TR}$ [%] | $T_{600\text{-}700(A)TR}$ [%] |
|---|---|---|---|---|---|
| Ex. 5 | A5 | 929 | 92.5 | 90.0 | 94.3 |
| Ex. 8 | Acf | 874 | 64.0 | 64.8 | 80.8 |

As apparent from the results in Table 5, the absorption layer using NIR Dye (A5) of Example 5 as Example of the present invention shows a high transmittance of 90% or more in all of the average transmittance $T_{400\text{-}500(A)TR}$ at a wavelength within the range of 400 nm to 500 nm, the average transmittance $T_{500\text{-}600(A)TR}$ at a wavelength within the range of 500 nm to 600 nm, and the average transmittance $T_{600\text{-}700(A)TR}$ at a wavelength within the range of 600 nm to 700 nm. On the other hand, the absorption layer using NIR Dye (Acf) of Example 8 as Comparative Example shows a low transmittance of 60% to 80% level in all of the transmittances. These results demonstrate that the Dye (A) of Example of the present invention is an excellent near-infrared absorbing dye exhibiting a high transmittance in the visible light region and having light absorption in the near-infrared region.

Ex. 16

An optical filter having a configuration illustrated in FIG. 7 is manufactured by the following method.

As the transparent substrate, a 0.21 mm-thick glass substrate including CuO-containing fluorophosphates glass (manufactured by Asahi Glass Co., Ltd., trade name: NF-50GX) or a 0.2 mm-thick glass substrate (D263; manufactured by SCHOTT AG., trade name) is used.

As the reflection layer, a dielectric multilayer film formed as follows is used. The dielectric multilayer film is formed by, for example, stacking a total of 42 alternating layers of $TiO_2$ film and $SiO_2$ film on one main surface of the glass substrate by vapor deposition method. The configuration of the reflection layer is simulated using, as parameters, the number of layers stacked in the dielectric multilayer film, the thickness of the $TiO_2$ film, and the thickness of the $SiO_2$ film, and designed such that in the spectral transmittance curve at an incident angle of 0°, the average transmittance of light with a wavelength within the range of 850 nm to 1,100 nm is 0.03%.

In addition, on a main surface of the glass substrate opposite to the surface where the reflection layer is formed, an absorption layer having a thickness of about 1.0 μm is formed by combining a transparent resin with one kind or two or more kinds of NIR dyes (A). After that, an antireflection layer is formed on the surface of the absorption layer by stacking 7 alternating layers of $TiO_2$ film and $SiO_2$ film by vapor deposition method to obtain an optical filter (NIR filter).

While the present invention has been described in detail and with reference to specific embodiments thereof, it will be apparent to one skilled in the art that various changes and modifications can be made therein without departing from the spirit and scope thereof. This application is based on Japanese Patent Application No. 2018-103772 filed on May 30, 2018, the entire subject matter of which is incorporated herein by reference.

INDUSTRIAL APPLICABILITY

The optical filter of the present invention provides good visible light transmission and excellent near-infrared blocking property, particularly, long-wavelength near-infrared blocking property, and therefore, is useful for use in an optical filter for an imaging device in the instrument having both an imaging device and an optical member using laser light.

REFERENCE SIGNS LIST 10A, 10B, 10C, 10D, 10E, 10F, 10G: Optical filter
11, 11a, 11b: Absorption layer
12, 12a, 12b: Reflection layer
13: Transparent substrate
14: Antireflection layer

The invention claimed is:
1. A near-infrared absorbing dye comprising a compound represented by formula (A):

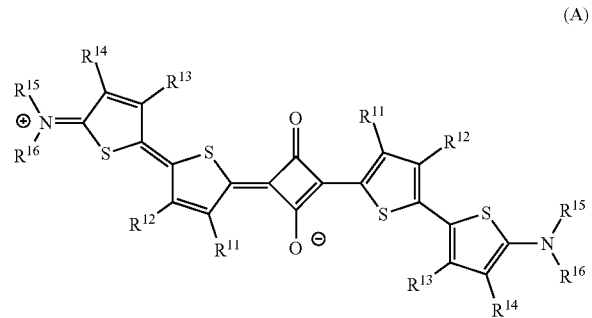

(A)

wherein:
each of $R^{11}$ to $R^{14}$ is independently a hydrogen atom, a halogen atom, a hydroxyl group, an alkyl group, an aryl group, or an alkyl group directly bound to an aromatic ring, where the alkyl group, the aryl group, and the alkyl group directly bound to an aromatic ring may include a substituent, may contain an unsaturated bond, an oxygen atom, an ester bond, an amide bond, or a thioamide bond between two carbon atoms, and may include an oxygen atom, an ester bond, an amide bond, or a terminal thioamide bond attached to the thiophene ring;
each of pairs $R^{11}$ and $R^{12}$, $R^{12}$ and $R^{13}$, and $R^{13}$ and $R^{14}$ may combine with one another to form a monocyclic ring or a polycyclic ring in which from 2 to 4 rings are fused, and in the case wherein a polycyclic ring is present, a hydrogen atom bonded to the ring may be substituted with a substituent;
each of $R^{15}$ and $R^{16}$ is independently an alkyl group which may include a substituent and may contain an unsaturated bond, an oxygen atom or a nitrogen atom between two carbon atoms; and
$R^{15}$ and $R^{16}$ may combine with one another to form a cyclohetero ring having from 5 to 10 members together with the nitrogen atom, and in this, a hydrogen atom bonded to the ring may be substituted with a substituent.

2. The near-infrared absorbing dye according to claim 1, wherein the compound is a compound represented by formula (Aa):

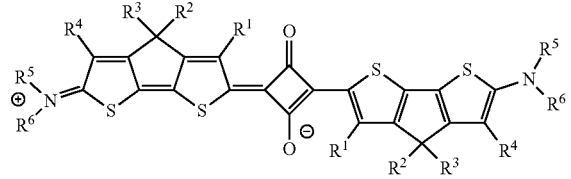

(Aa)

wherein:
each of $R^1$ to $R^4$ is independently a hydrogen atom, a halogen atom, a hydroxyl group, an alkyl group, an aryl group, or an alkyl group directly bound to an aromatic ring, where the alkyl group, the aryl group, and the alkyl group directly bound to an aromatic ring may include a substituent, may contain an unsaturated bond, an oxygen atom, an ester bond, an amide bond, or a thioamide bond between two carbon atoms, and may include an oxygen atom, an ester bond, an amide bond, or a terminal thioamide bond attached to the thiophene ring;
each of $R^5$ and $R^6$ is independently an alkyl group which may include a substituent and may contain an unsaturated bond, an oxygen atom or a nitrogen atom between two carbon atoms; and
$R^5$ and $R^6$ may combine with one another to form a cyclohetero ring having from 5 to 10 members together with the nitrogen atom, and in this case, a hydrogen atom bonded to the ring may be substituted with a substituent.

3. The near-infrared absorbing dye according to claim 2, wherein $R^1$ is a hydrogen atom.

4. The near-infrared absorbing dye according to claim 1, wherein the compound is a compound represented by formula (Ab):

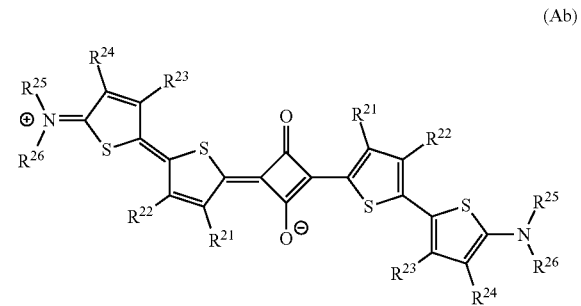

(Ab)

wherein:
each of $R^{21}$ to $R^{24}$ is independently a hydrogen atom, a halogen atom, a hydroxyl group, an alkyl group, an aryl group, or an alkyl group directly bound to an aromatic ring, where the alkyl group, the aryl group, and the alkyl group directly bound to an aromatic ring may include a substituent, may contain an unsaturated bond, an oxygen atom, an ester bond, an amide bond, or a thioamide bond between two carbon atoms, and may include an oxygen atom, an ester bond, an amide bond, or a terminal thioamide bond attached to the thiophene ring;
each of pairs $R^{21}$ and $R^{22}$, and $R^{23}$ and $R^{24}$ may combine with one another to form a monocyclic ring or a polycyclic ring in which from 2 to 4 rings are fused, and in the case wherein a polycyclic ring is present, a hydrogen atom bonded to the ring may be substituted with a substituent, wherein $R^{22}$ and $R^{23}$ do not combine with one another;
each of $R^{25}$ and $R^{26}$ is independently an alkyl group which may include a substituent and may contain an unsaturated bond, an oxygen atom or a nitrogen atom between two carbon atoms; and
$R^{25}$ and $R^{26}$ may combine with one another to form a cyclohetero ring having from 5 to 10 members together with the nitrogen atom, and in this case, a hydrogen atom bonded to the ring may be substituted with a substituent.

5. The near-infrared absorbing dye according to claim 4, wherein $R^{22}$ is a hydrogen atom, a hydroxyl group, or an alkyl group which may include a substituent, may contain an unsaturated bond, an oxygen atom, an ester bond, an amide bond, or a thioamide bond between two carbon atoms, and may include an oxygen atom, an ester bond, an amide bond, or a terminal thioamide bond attached to the thiophene ring.

6. An optical filter comprising an absorption layer containing the near-infrared absorbing dye according to claim 1 and a resin.

7. The optical filter according to claim 6, further comprising a reflection layer including a dielectric multilayer film.

8. The optical filter according to claim 6, further comprising a transparent substrate, wherein the absorption layer is provided on the transparent substrate.

9. The optical filter according to claim 8, wherein the transparent substrate comprises a glass.

10. The optical filter according to claim 9, wherein the glass is a near-infrared absorbing glass.

11. The optical filter according to claim 8, wherein the transparent substrate comprises a resin.

12. An imaging device comprising a solid-state image sensor, an imaging lens, and the optical filter according to claim 6.

* * * * *